US011004746B2

United States Patent
Lee et al.

(10) Patent No.: US 11,004,746 B2
(45) Date of Patent: May 11, 2021

(54) METHOD FOR FORMING A SEMICONDUCTOR STRUCTURE USING DEHYDRATING CHEMICAL, AND METHOD FOR FORMING A SEMICONDUCTOR STRUCTURE

(71) Applicant: TAIWAN SEMICONDUCTOR MANUFACTURING COMPANY LTD., Hsinchu (TW)

(72) Inventors: Chung-Chieh Lee, Taipei (TW); Chi-Ming Yang, Hsinchu (TW); Chyi Shyuan Chern, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/678,606

(22) Filed: Nov. 8, 2019

(65) Prior Publication Data

US 2020/0168508 A1    May 28, 2020

Related U.S. Application Data

(60) Provisional application No. 62/772,249, filed on Nov. 28, 2018.

(51) Int. Cl.
*H01L 21/66* (2006.01)
*H01L 21/8234* (2006.01)
*H01L 29/66* (2006.01)

(52) U.S. Cl.
CPC ...... *H01L 21/823431* (2013.01); *H01L 22/10* (2013.01); *H01L 29/66795* (2013.01)

(58) Field of Classification Search
CPC ............ H01L 21/823431; H01L 22/10; H01L 29/66795
USPC .......................................................... 438/15
See application file for complete search history.

(56) References Cited

U.S. PATENT DOCUMENTS 9,050,652 B2 * 6/2015 Ydstie ..................... C30B 29/64
2018/0151348 A1 * 5/2018 Lee ................... H01L 21/02057

FOREIGN PATENT DOCUMENTS

CN    101144051 A    3/2008

OTHER PUBLICATIONS

Hexachloroethane Compound Information and Applications for GC (Gas Chromatography) and LC (Liquid Chromatography) Analysis, RESTEK.

(Continued)

*Primary Examiner* — Luan C Thai
(74) *Attorney, Agent, or Firm* — WPAT, P.C., Intellectual Property Attorneys; Anthony King

(57) ABSTRACT

The present disclosure provides a dehydrating chemical for dehydrating a semiconductor substrate under an ambient temperature, including a first chemical having a melting point below the ambient temperature, and a second chemical having a melting point greater than the melting point of the first chemical, wherein the dehydrating chemical has a melting point less than the ambient temperature by predetermined $\Delta T_0$ degrees, and at least one of the first chemical and the second chemical has a saturated vapor pressure greater than a predetermined pressure $P_{SV}$ under 1 atm.

20 Claims, 21 Drawing Sheets

(56) References Cited

OTHER PUBLICATIONS

Isopropyl Alcohol Compound Information and Applications for GC (Gas Chromatography) and LC (Liquid Chromatography) Analysis, RESTEK.
Office Action, Cited References and Search Report dated Feb. 9, 2021 issued by the Taiwan Intellectual Property Office for counterpart application No. 108143242 (provided with brief translation).
English Abstract of CN101144051A.
Brief English Translation of the Office Action, Cited References and Search Report dated Feb. 9, 2021 issued by the Taiwan Intellectual Property Office for counterpart application No. 108143242.

* cited by examiner

METHOD FOR FORMING A SEMICONDUCTOR STRUCTURE USING DEHYDRATING CHEMICAL, AND METHOD FOR FORMING A SEMICONDUCTOR STRUCTURE

CROSS REFERENCE TO RELATED APPLICATIONS

This application claims the benefit of prior-filed provisional application No. 62/772,249, filed Nov. 28, 2018, which is incorporated by reference in its entirety.

BACKGROUND

As fabrication techniques for semiconductor integrated circuits continue to develop, the number of elements in a chip has increased. For some examples, high aspect ratio fin structures were key elements to achieve required cell capacitance in the fabrication devices. However, after various kinds of aqueous processing of silicon wafers, residual moisture may be remained on a surface of a substrate, thereby interfere the procedures in advance and induce defects; thence the substrate is entailed to be dehydrated after aqueous operations in order to alleviate the defects on fin structures caused by residual moisture.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
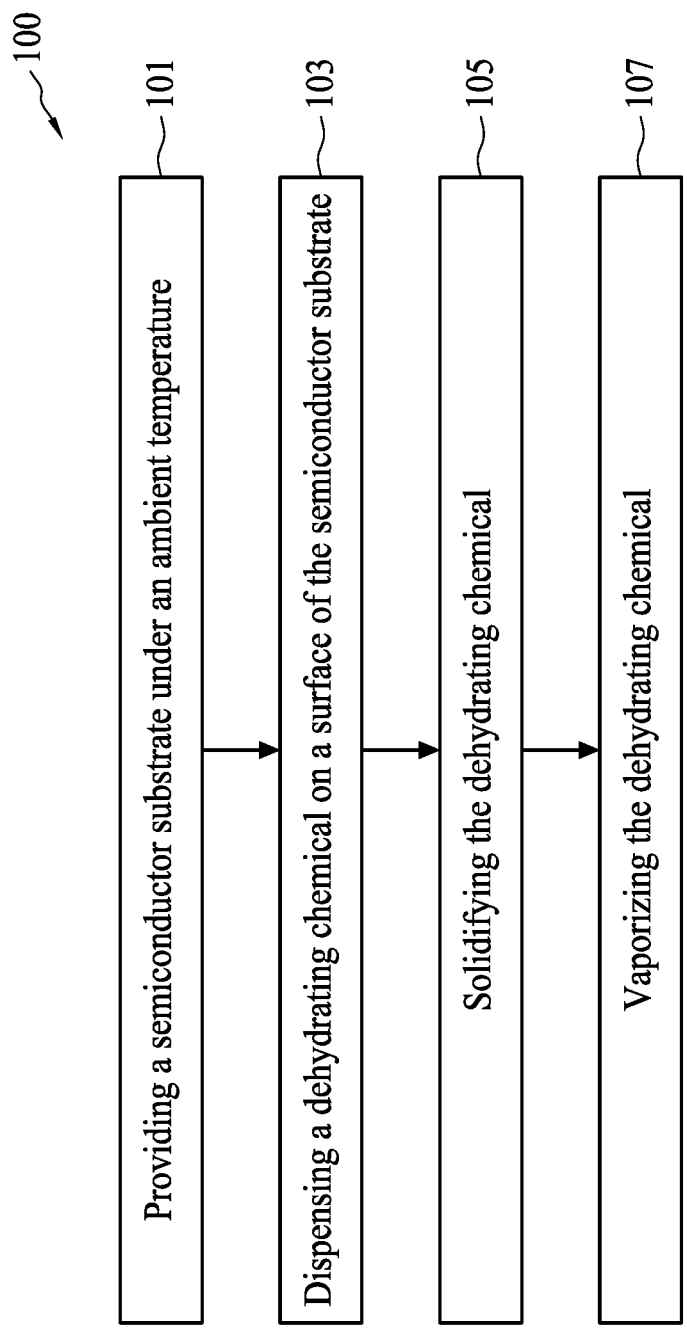
FIG. 1A shows a flow chart representing method for dehydrating a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In a comparative embodiment, a dehydration operation may include spinning a substrate at a high rotating speed, as water or drying chemicals applied on the substrate can be spun off the edge by centrifugal force. However, semiconductor structures (including but not limited to fin structures, logic device, a DRAM structure, a semiconductor stripe, a tube, a recess, an array structure, a tube, a wiring, an intermediate semiconductor structure during gate forming fabrication, an intermediate logic device during fabrication) with high aspect ratio are weak and prone to be damaged throughout the duration of spinning due to the surface tension applied on the fin structures. According to Young-Laplace equation, the Laplace pressure between an air-liquid interface has a positive correlation with surface tension, contact angle, and distance between two given fin structures. Meanwhile the pattern deflection has a positive correlation with pattern height, aspect ratio, contact angle, and Laplace pressure. Therefore surface tension and contact angle are two of the major factors pertinent to pattern deflection. The pattern of the fin structures may collapse and induce defect after dehydration operations. Furthermore, the collapsed fin structures cannot be effectively recovered in subsequent operations. Other conventional dehydration operations such as isopropyl alcohol (IPA) vapor dryer and marangoni dryer may induce substantially higher cost and/or induce safety issues due to the challenging handling of the flammable IPA vapor.

The present disclosure provides a dehydrating chemical for dehydrating a semiconductor substrate, an apparatus for dehydrating a semiconductor substrate, and a method for dehydrating a semiconductor structure, wherein the fin collapse issue caused by surface tension can be alleviated, while residual moisture on a substrate can be effectively removed.

Referring to FIG. 1A, FIG. 1A shows a flow chart representing method 100 for dehydrating a semiconductor structure, in accordance with some embodiments of the present disclosure. The method 100 for dehydrating a semiconductor structure may include providing a semiconductor substrate under an ambient temperature (operation 101), dispensing a dehydrating chemical on a surface of the semiconductor substrate (operation 103), solidifying the dehydrating chemical (operation 105), and vaporizing the dehydrating chemical (operation 107).

Figure 1B:
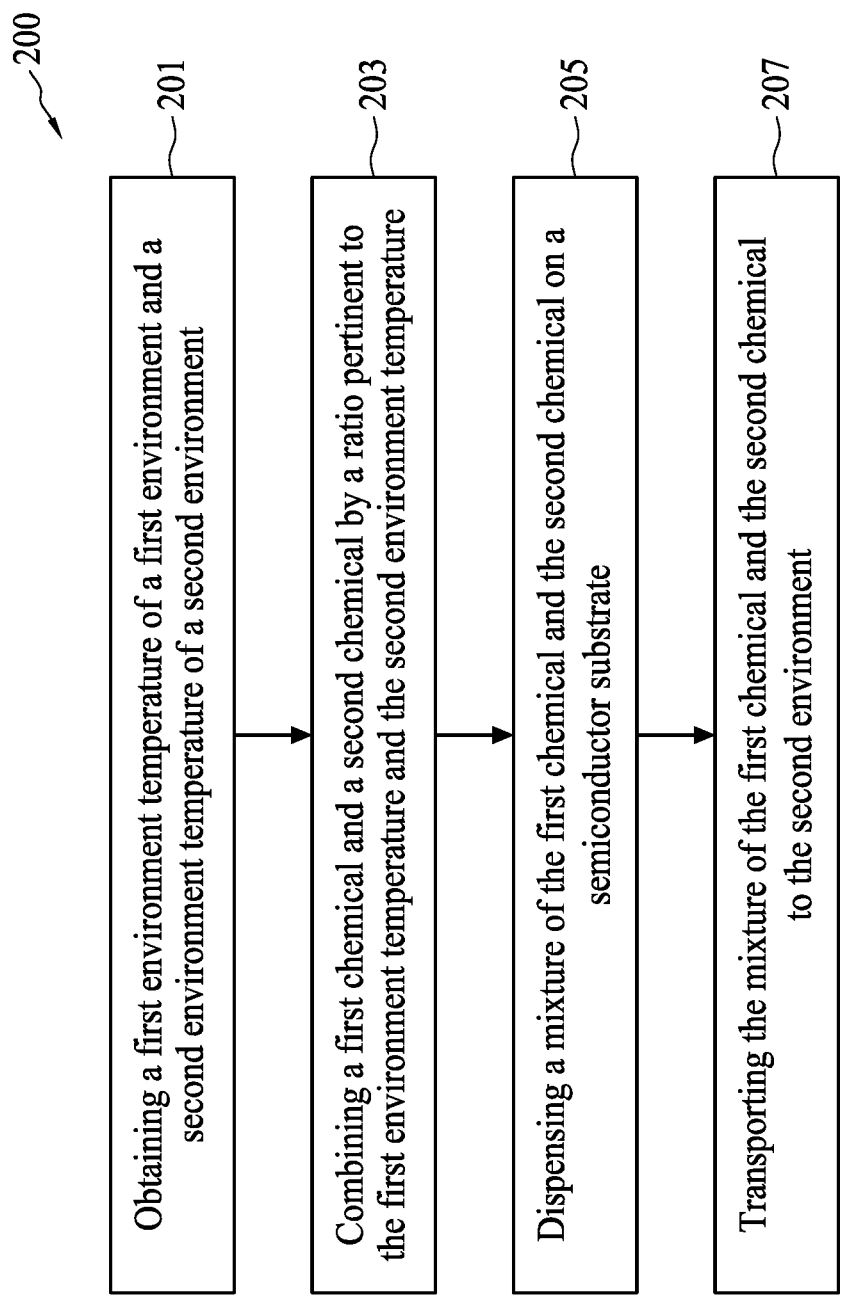
FIG. 1B shows a flow chart representing method for dehydrating a semiconductor structure, in accordance with some embodiments of the present disclosure.

Referring to FIG. 1B, FIG. 1B shows a flow chart representing method 200 for dehydrating a semiconductor structure, in accordance with some embodiments of the present disclosure. The method 200 for dehydrating a semiconductor structure may include obtaining a first temperature of a first environment and a second temperature of a second environment (operation 201), combining a first chemical and a second chemical by a ratio pertinent to the first temperature and the second temperature (operation 203), dispensing a mixture of the first chemical and the second chemical on a semiconductor substrate (operation 205), and transporting the mixture of the first chemical and the second chemical to the second environment (operation 207).

Figure 2:
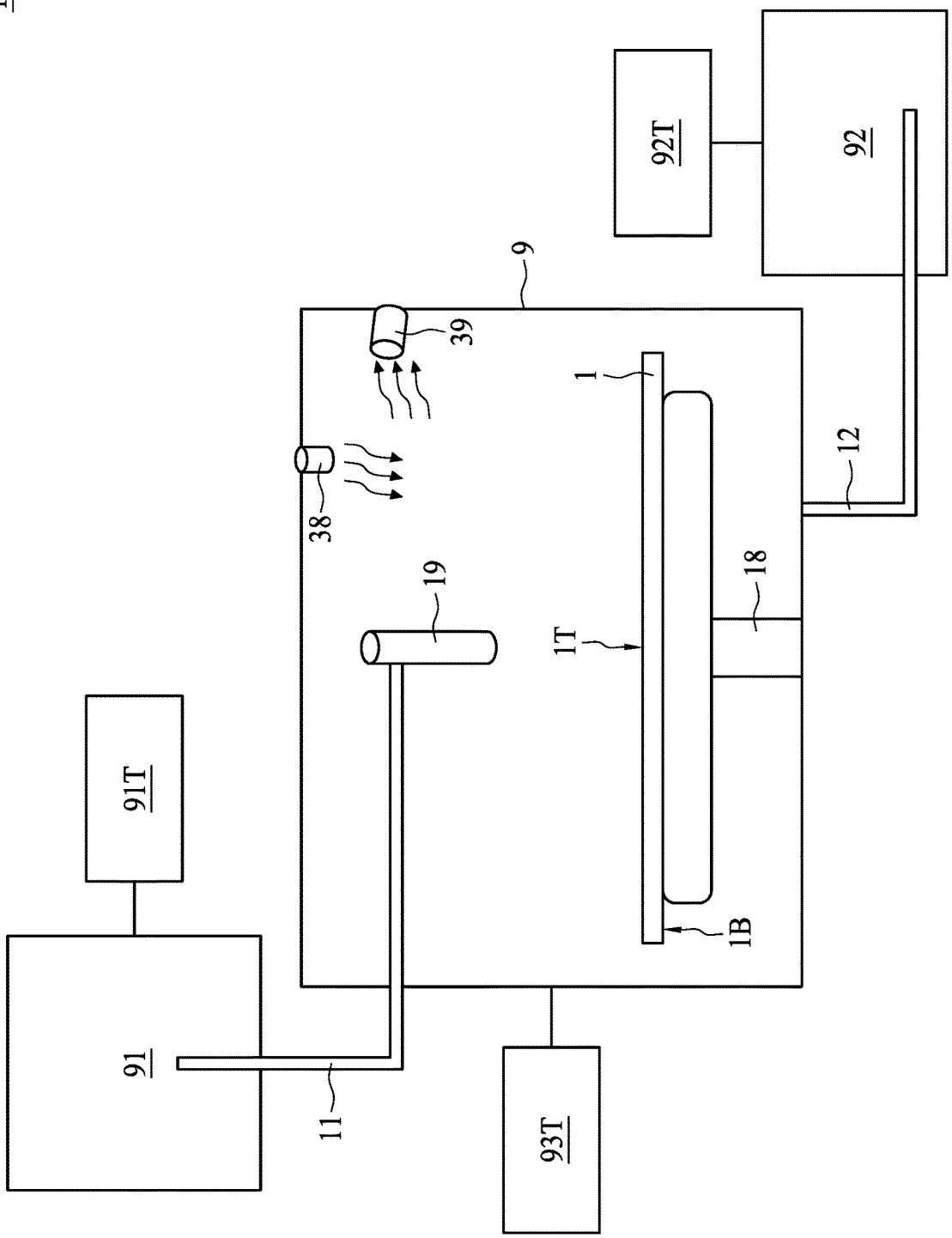
FIG. 2 is a schematic drawing illustrating an apparatus for dehydrating a semiconductor structure, in accordance with some embodiments of the present disclosure.

Referring to FIG. 2, FIG. 2 is a schematic drawing illustrating an apparatus for dehydrating a semiconductor structure, in accordance with some embodiments of the present disclosure. The apparatus 1000 at least includes a chamber 9, a dispensing head 19, a supporter 18, and a first conduit 11. The supporter 18 is configured to secure a substrate 1 inside the chamber 9, wherein the supporter 18 includes a rotation mechanism configured to rotate the substrate 1. The apparatus 1000 can optionally include a supply (not shown), wherein the supply may include a storage space for accommodating wet chemical and a pump for supplying wet chemical, and the wet chemical can be transported through the first conduit 11 to the dispensing head 19. The dispensing head 19 is disposed above the substrate 1, and is configured to apply dehydrating chemical on a first side 1T of the substrate 1. The composition of the dehydrating chemical will be subsequently discussed.

In some embodiments, at least a portion of the first conduit 11 and/or the supply is disposed under a first environment 91, wherein the first environment 91 has a first environment temperature $T_{E1}$. The apparatus 1000 may optionally include a second conduit 12 configured to transport wet chemical drained from the chamber 9 to a second environment 92, wherein the second environment 92 has a second environment temperature $T_{E2}$. At least a portion of the second conduit 12 is within the second environment. A first temperature sensor 91T and a second temperature sensor 92T are respectively configured to detect a temperature of the first environment 91, and a temperature the second environment 92. In some embodiments, the second environment 92 is inside the sub-fab area below the apparatus 1000. The apparatus 1000 may further include a third temperature sensor 93T configured to detect an ambient temperature $T_9$ inside the chamber 9. In some embodiments, the ambient temperature $T_9$ inside the chamber 9 is similar to a temperature in a peripheral area of the apparatus 1000.

Figure 3:
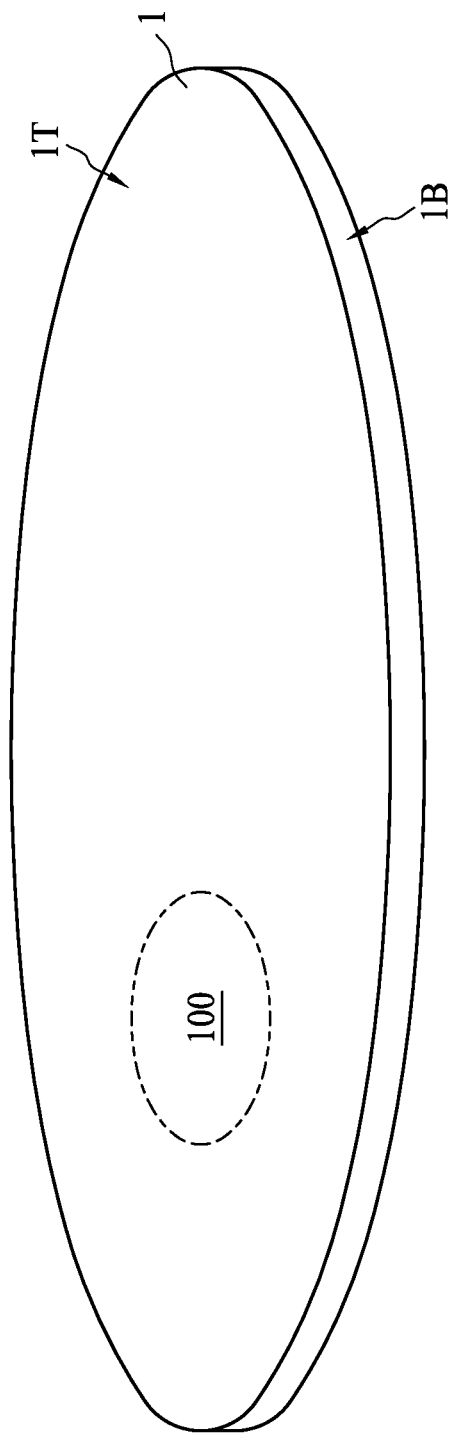
FIG. 3 is schematic diagram of a given area on a substrate, in accordance with some embodiments of the present disclosure.
Figure 4:
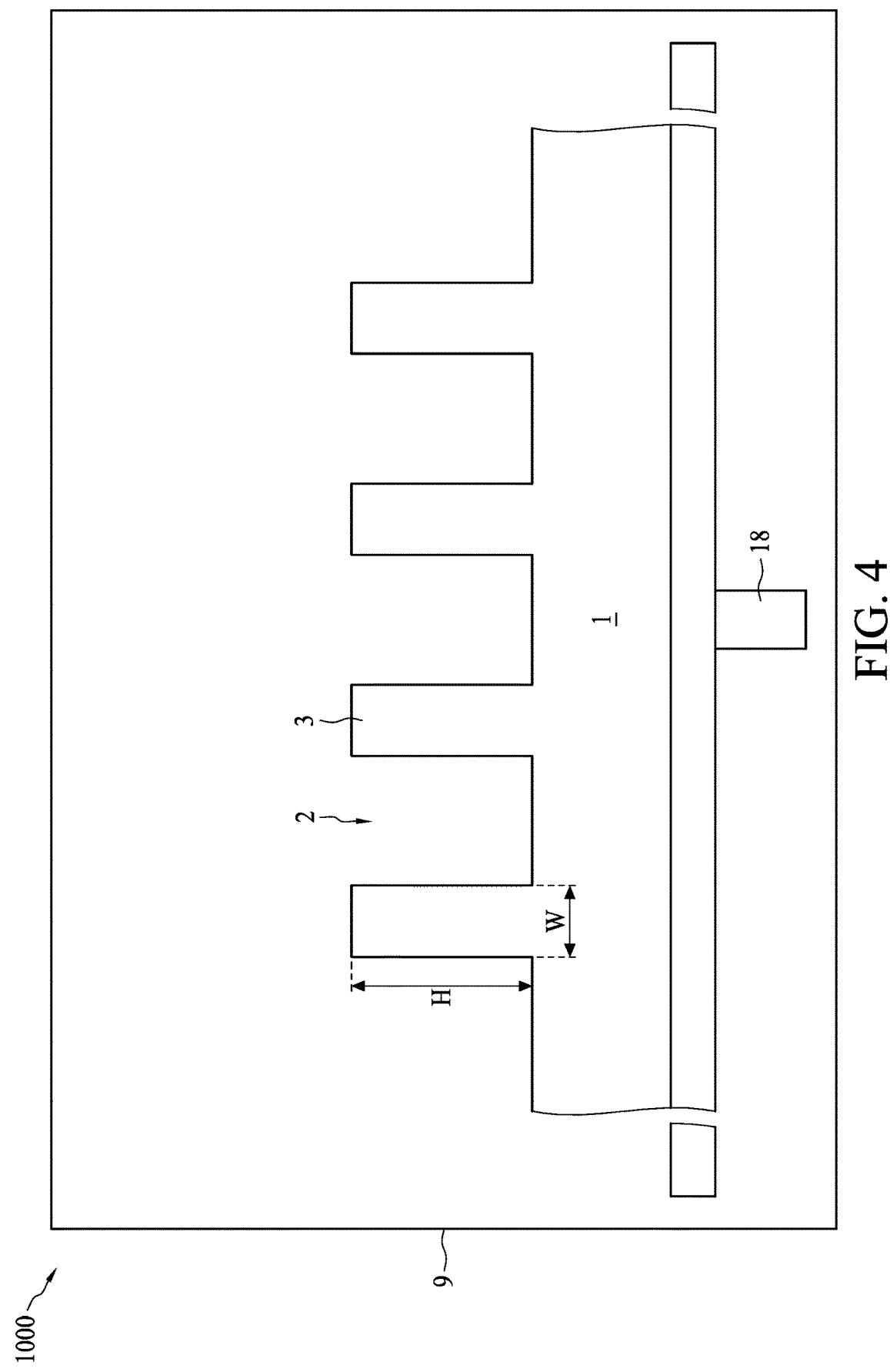
FIG. 4 is a cross section of a semiconductor structure during intermediate stages of dehydration operations, in accordance with some embodiments of the present disclosure.

Referring to FIG. 3 and FIG. 4, FIG. 3 is schematic diagram of a given area on a substrate, and FIG. 4 is a cross section of a semiconductor structure during intermediate stages of dehydration operations, in accordance with some embodiments of the present disclosure. The substrate 1 may be a semiconductor substrate for fabricating various types of devices. At least within a first area 100, a plurality of trenches 2 and a plurality of fins 3 are formed on a first side 1T of the substrate 1. In some embodiments, the plurality of trenches 2 and fins 3 can be formed by any suitable operation including etching operation, photolithography, deep reactive-ion etching, deposition operation, or the like. In some embodiments, the plurality of trenches 2 can be a trench array. In some of the embodiments, at least one fin of the plurality of fins 3 has an aspect ratio (a ratio of a height H over a width W) greater than 11 and less than 30, wherein the fin 3 is significantly prone to be deflected by external force if the fin has an aspect ratio over 11. The dehydration method of the present disclosure is specifically effective for structures having an aspect ratio less than 30. As previously discussed, the resistance against deflection of a given fin structure has a negative correlation to the aspect ratio per se, while the resistance against deflection of a given fin structure has a positive correlation to the Young's modulus of the given fin structure.

Optionally, subsequent to forming the plurality of trenches 2 and the plurality of fins 3, the first side 1T of the substrate 1 can be cleaned. In some embodiments, the cleaning process includes using various acidic chemical, alkaline chemical, deionized water, and/or reactive oxygen solution. In some embodiments, particles and metallic contamination may be removed by applying a mixture of deionized water, ammonium hydroxide ($NH_4OH$), and aqueous hydrogen dioxide ($H_2O_2$). However this mixture may result in the formation of a thin silicon oxide layer along with metallic contamination. In some embodiments, hydrogen fluoride (HF) can be used to remove a thin oxide layer and some fraction of ionic contaminants. A mixture of sulfuric acid ($H_2SO_4$) and aqueous hydrogen dioxide ($H_2O_2$) can be used to remove bigger size organic residues off the substrate 1. The mixture of deionized water, aqueous hydrochloric acid (HCl), and aqueous hydrogen dioxide ($H_2O_2$) can be used to remove traces of metallic ion containments.

Subsequently, a surface of the plurality of trenches 2 and a surface of the plurality of fins 3 are optionally converted into hydrophobic surfaces. In some embodiments, dilute hydrofluoric acid is dispensed from the first side 1T of the substrate 1 to flow through the surface of the plurality of trenches 2 and the surface of the plurality of fins 3. Diluted hydrogen fluoride acid (HF) is used to remove a thin layer of the substrate 1 and form silicon-fluorine bonds with the exposed surface, leaving behind hydrophobic surfaces. After the treatment, the hydrogen oxide ($H_2O$) molecules on the first side 1T have a higher tendency to bond to other hydrogen oxide molecules rather than bonding with the first side 1T of the substrate 1. Hydrogen oxide molecules are easier to be removed on hydrophobic surfaces, thus forming hydrophobic surfaces helps improve the effectiveness of the following dehydration operation. The creation of hydrophobic surfaces may be followed by a deionized water rinsing operation. The deionized water may be dispensed into the plurality of trenches 2 and flowed through spaces between the plurality of fins 3. The deionized water removes residual diluted hydrogen fluoride acid (HF) and further covers above the first side 1T.

In some embodiments, before dehydrating the substrate 1, a liquidus solvent is dispensed into the plurality of trenches 2 and flowed through spaces between the plurality of fins 3. The liquidus solvent is miscible with deionized water, therefore the liquidus solvent can substantially displace the deionized water inside the plurality of trenches 2 and above the first side 1T. In some embodiments, the liquidus solvent includes isopropyl alcohol (IPA). Optionally, during the operation of dispensing the liquidus solvent, the substrate 1 can be rotated at a low rotating speed to prevent the liquidus solvent from flowing onto a second side 1B of the substrate 1 opposite to the first side 1T. For example, the rotating speed is lower than 50 rpm to avoid incurring fin collapse. In some other embodiments, the substrate 1 is not rotated herein.

Subsequently, a dehydration operation can be performed. FIG. 5 to FIG. 11 illustrates a method for dehydrating a semiconductor structure, and FIG. 12 to FIG. 16 illustrates another method for dehydrating a semiconductor structure.

Figure 5:
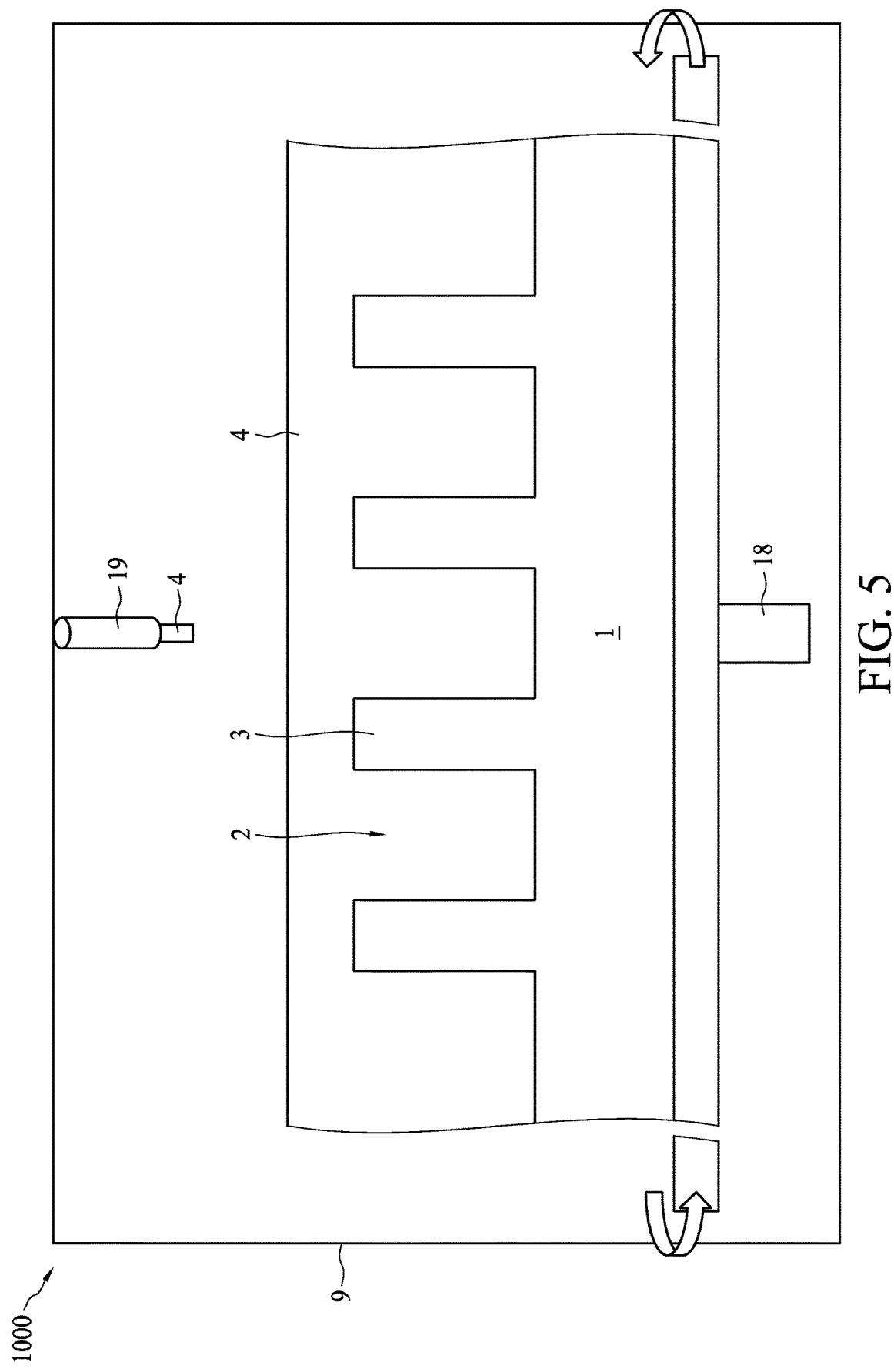
FIG. 5 is a cross section of a semiconductor structure during intermediate stages of dehydration operations, in accordance with some embodiments of the present disclosure.

Referring to FIG. 2 and FIG. 5, FIG. 5 is a cross section of a semiconductor structure during intermediate stages of dehydration operations, in accordance with some embodiments of the present disclosure. A dehydrating chemical 4 is applied on the first side 1T of the substrate 1 and flowed through the surface of the plurality of trenches 2 and the surface of the plurality of fins 3. In order to uniformly spread out the dehydrating chemical 4 on the first side 1T of the substrate 1, the dehydrating chemical 4 is in liquid state, instead of in solid state. Alternatively stated, the ambient temperature $T_9$ inside the chamber 9 and a temperature of dehydrating chemical 4 as-applied on the substrate 1 are greater than a melting point of the dehydrating chemical 4 by predetermined $\Delta T_0$ degrees.

However in some embodiments, the first environment temperature $T_{E1}$ of the first environment 91 and/or the second environment temperature $T_{E2}$ of the second environment 92 are lower than the ambient temperature $T_9$ inside the chamber 9. If the melting point of the dehydrating chemical 4 is greater than the first environment temperature $T_{E1}$ of the first environment 91, the dehydrating chemical 4 may be solidified in the first conduit 11, further inducing the risk of clogging up the first conduit 11 and thus the delivery of dehydrating chemical 4 may be hindered. Similarly, if the melting point of the dehydrating chemical 4 is greater than the second environment temperature $T_{E2}$ of the second environment 92, the dehydrating chemical 4 may be solidified in the second conduit 12, further inducing the risk of clogging up the second conduit 12 and thus the draining of dehydrating chemical 4 may be hindered as backflow of the dehydrating chemical 4 may be induced.

Therefore, the melting point of the dehydrating chemical 4 can be adjust according to the first environment temperature $T_{E1}$ of the first environment 91, the second environment temperature $T_{E2}$ of the second environment 92, and the ambient temperature $T_9$ inside the chamber 9. Specifically, the melting point the dehydrating chemical 4 is lower than the ambient temperature $T_9$ inside the chamber 9 by at least predetermined $\Delta T_0$ degrees. For example, the melting point the dehydrating chemical 4 is lower than the ambient temperature $T_9$ by at least 1 degree, thus the fluctuation of the ambient temperature $T_9$ inside the chamber 9 may not induce the risk of solidifying the dehydrating chemical 4 prematurely. In addition, in order to reduce the risk of clogging the first conduit 11 and the second conduit 12, the melting point of the dehydrating chemical 4 is set to be below the first environment temperature $T_{E1}$ of the first environment 91 and the second environment temperature $T_{E2}$ of the second environment 92. In some embodiments, the melting point of the dehydrating chemical 4 is in a range from about 0° C. to about 20° C. when the ambient temperature $T_9$ inside the chamber 9 is in a range from 20° C. to about 30° C. In such example, since the ambient temperature $T_9$ inside the chamber 9 may fluctuate between about 20° C. to about 30° C., having the melting point of the dehydrating chemical 4 to be below 20° C. may reduce the risk of solidifying the dehydrating chemical 4 prematurely. Also, in order to solidify the dehydrating chemical 4 with coolant with lower cost (as the cooling operation will be discussed subsequently), the melting point of the dehydrating chemical 4 is set to be greater than 0° C. It should be noted that if a coolant having a temperature substantially lower than 0° C. is utilized herein, the melting point of the dehydrating chemical 4 can be set to be lower than 0° C. in some other embodiments.

Figure 6:
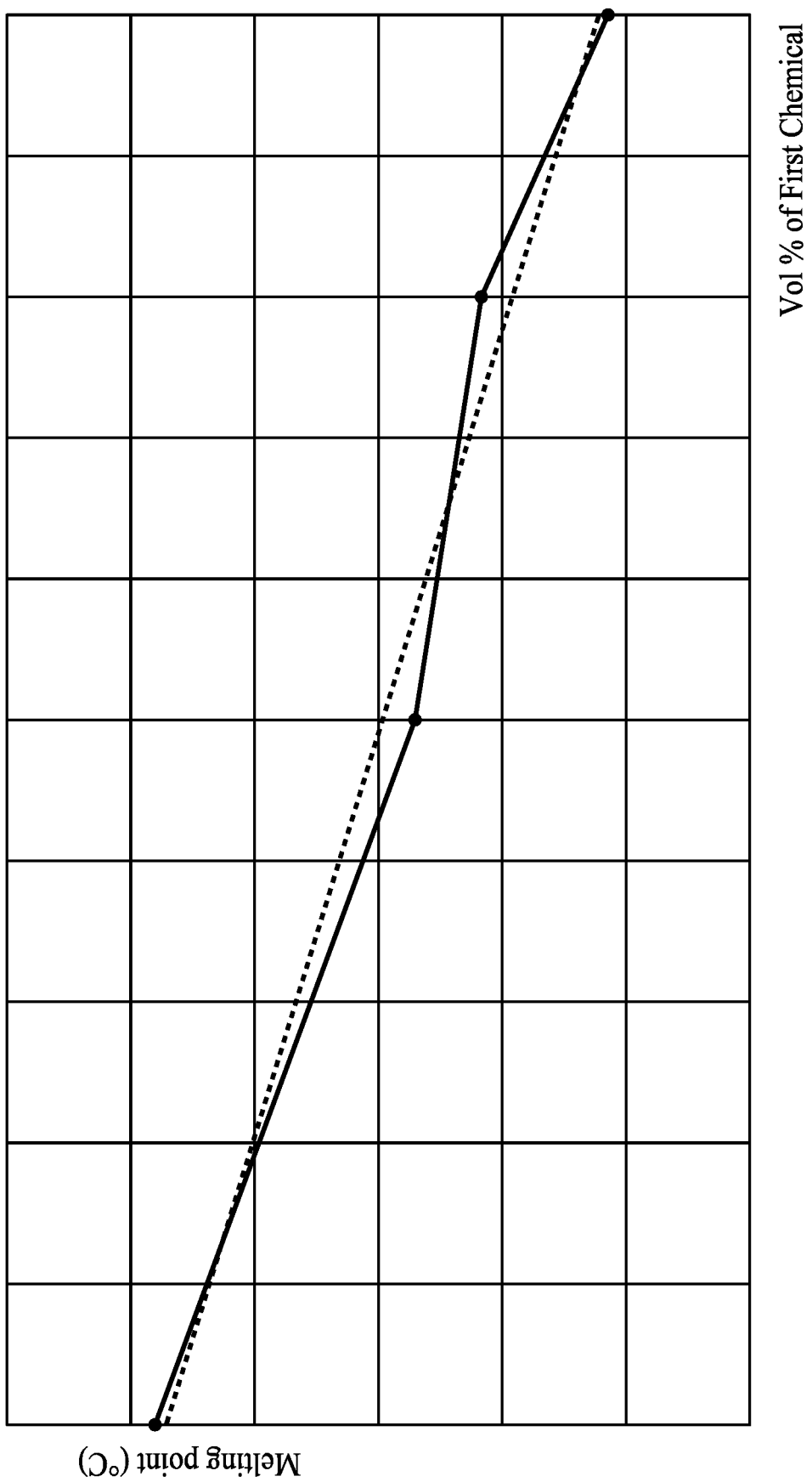
FIG. 6 is a schematic diagram illustrating a relationship between a melting point of a dehydrating chemical and a volume percentage of a first chemical of the dehydrating chemical, in accordance with some embodiments of the present disclosure.

Referring to FIG. 6, FIG. 6 is a schematic diagram illustrating a relationship between a melting point of a dehydrating chemical and a volume percentage of a first chemical of the dehydrating chemical, in accordance with some embodiments of the present disclosure. The melting point of the dehydrating chemical 4 can be adjusted by combining a first chemical and a second chemical by a mixing ratio pertinent to the first environment temperature $T_{E1}$ of the first environment 91 and the second environment temperature $T_{E2}$ of the second environment 92. Herein the first chemical has a first melting point below the ambient temperature $T_9$ inside the chamber 9; while the second chemical has a second melting point greater than the ambient temperature $T_9$ inside the chamber 9. In some embodiments, the first chemical may include at least one of the isopropyl alcohol (IPA), $CH_3COCH_3$ (acetone), propylene glycol monomethyl ether acetate (PGMEA), propylene glycol monomethyl ether (PGMEA), a mixture of at least two of the aforementioned chemicals, or the like. In some embodiments, the second chemical may include at least one of the tert-butanol (TBA), hexachloroethane, pentaerythritol, camphor, tropinone, norcamphor, naphthalene, cyclohexanol, camphene, borneol, and isoborneol, a mixture of at least two of the aforementioned chemicals, or the like. The concentration of the first chemical and the second chemical in the dehydrating chemical 4 can be expressed in volume concentration, mass concentration, molar concentration, or the like.

For example, the first chemical can be isopropyl alcohol (IPA), wherein IPA has a melting point about −89° C. and a saturated vapor pressure about 5.3 kPa under standard pressure (1 atm); and the second chemical can be tert-butanol (TBA), wherein TBA has a melting point about 25° C. and a saturated vapor pressure about 4.1 kPa under standard pressure (1 atm). Herein the criticality of the saturated vapor pressure of the first chemical and the second chemical will be subsequently discussed in FIG. 9 and FIG. 10. In addition, the measured first environment temperature $T_{E1}$ of the first environment 91 is 21° C., the second environment temperature $T_{E2}$ of the second environment 92 is 20° C., and the ambient temperature $T_9$ inside the chamber 9 is 22° C. If TBA (second chemical) is individually transported by the first conduit 11 under the first environment temperature $T_{E1}$ and by the second conduit 12 under the second environment temperature $T_{E2}$, TBA may be solidified and the risk of clogging the first conduit 11 or the second conduit 12 is increased.

By mixing the IPA (first chemical) and the TBA (second chemical), the melting point of the mixture (dehydration chemical 4) can be tuned to be lower than the second environment temperature $T_{E2}$ of the second environment 92 (which is 20° C.), thus the dehydration chemical 4 can be remained in liquid state inside the first conduit 11, inside the second conduit 12, and inside the chamber 9. As shown in the diagram of FIG. 6, by raising a volume concentration of the first chemical, a melting point of the mixture of dehydration chemical 4 can be lowered. For example, 5% volume concentration of IPA and 95% volume concentration of TBA are mixed to obtain the dehydration chemical 4, and the melting point of the dehydration chemical 4 can be tuned to about 13.5° C. Similarly, a dehydration chemical 4 consisting of 8% volume concentration of IPA and 92% volume concentration of TBA has a melting point about 10.8° C.; a dehydration chemical 4 consisting of 10% volume concentration of IPA and 90% volume concentration of TBA has a melting point about 5.7° C.

In some embodiments, the melting point of the dehydration chemical 4 is at least $T_{flux}$ (e.g. 1° C.) lower than the minimum of the first environment temperature $T_{E1}$, the second environment temperature $T_{E2}$, and the ambient temperature $T_9$ inside the chamber 9 to avoid the risk of temperature fluctuation causing solidification of the dehydration chemical 4 inside the first conduit 11, inside the second conduit 12, or inside the chamber 9.

It should be noted that in some embodiments, the aforementioned supply of wet chemical (not shown in FIG. 2) may include separate supply storages to store the first chemical and the second chemical, and the first environment 91 can be deemed to include the location whereof the first chemical and the second chemical are mixed. For example, the first chemical can be supplied by a pump from a location distal to the apparatus 1000; while the second chemical can be supplied by a local supply bottle proximal to the apparatus 1000 so the risk of second chemical being solidified can be lowered. In some other embodiments, the supply of wet chemical may store a pre-mixed mixture of the first chemical and the second chemical (which can be dehydrating chemical 4). In some embodiments, in-situ adjustment of a ratio of the first chemical and the second chemical can be performed.

In some embodiments, the substrate 1 can be rotated at a first rotating speed by the supporter 18 to prevent the dehydrating chemical 4 from flowing onto the second side 1B (as shown in FIG. 2) of the substrate 1. For example, the first rotating speed is in a range from 0.1 rpm to 50 rpm. The dehydrating chemical 4 can be effectively spun off an edge of the substrate 1 when the first rotating speed is above 0.1 rpm. The first rotating speed is lower than 50 rpm to avoid incurring fin collapse. In some embodiments, the first rotating speed can be adjusted based on a viscosity of the dehydrating chemical 4, for example, if the dehydrating chemical 4 includes TBA and IPA, the first rotating speed can be set at about 5 rpm so the dehydrating chemical 4 can be effectively spread out and spun off an edge of the substrate 1. At least a portion of dispensed dehydrating chemical 4 is spun off the substrate 1 and subsequently drained through the second conduit 12 and transported to the second environment 92. In some other embodiments, the substrate 1 is not rotated.

Figure 7:
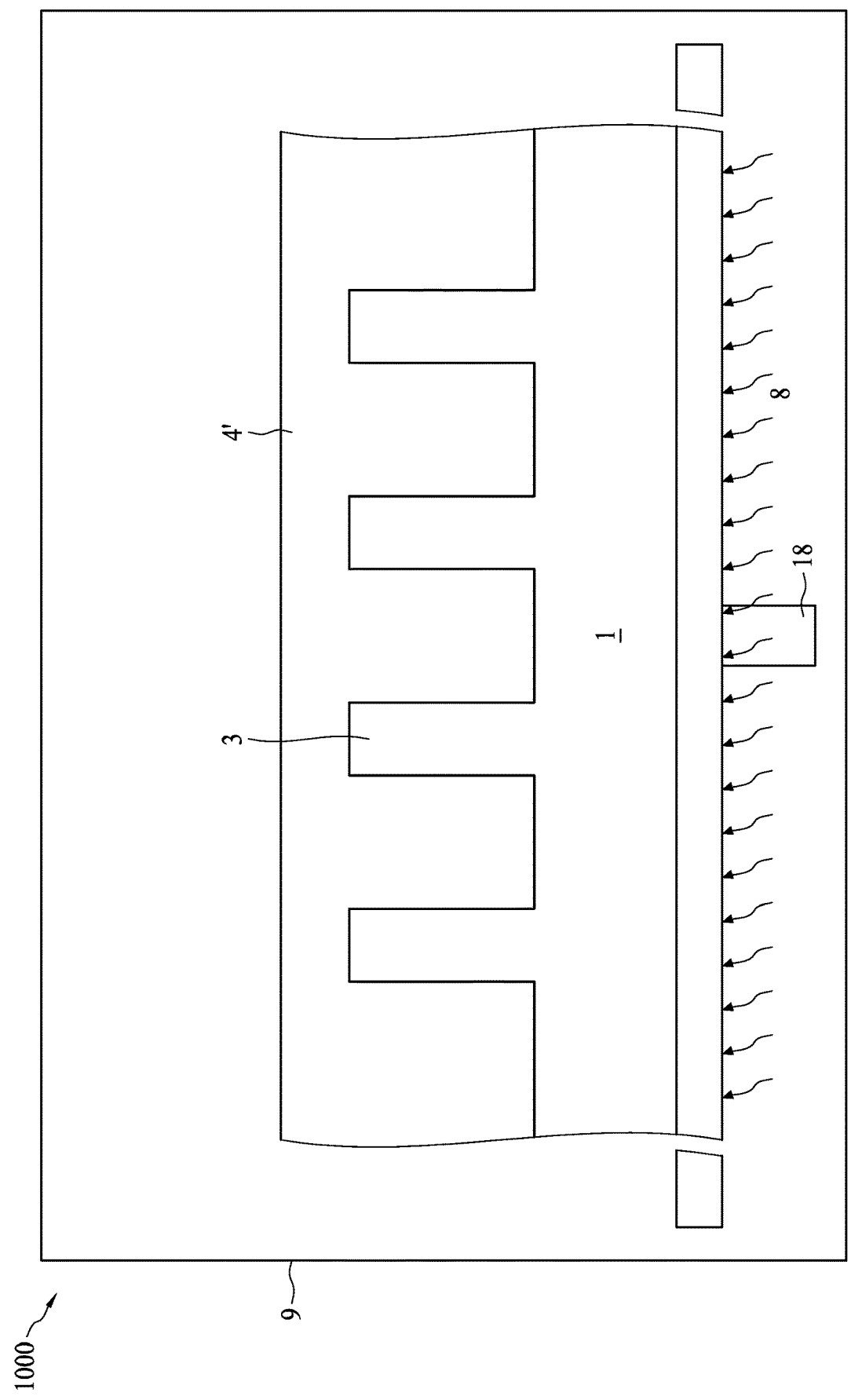
FIG. 7 is a cross section of a semiconductor structure during intermediate stages of dehydration operations, in accordance with some embodiments of the present disclosure.
Figure 8:
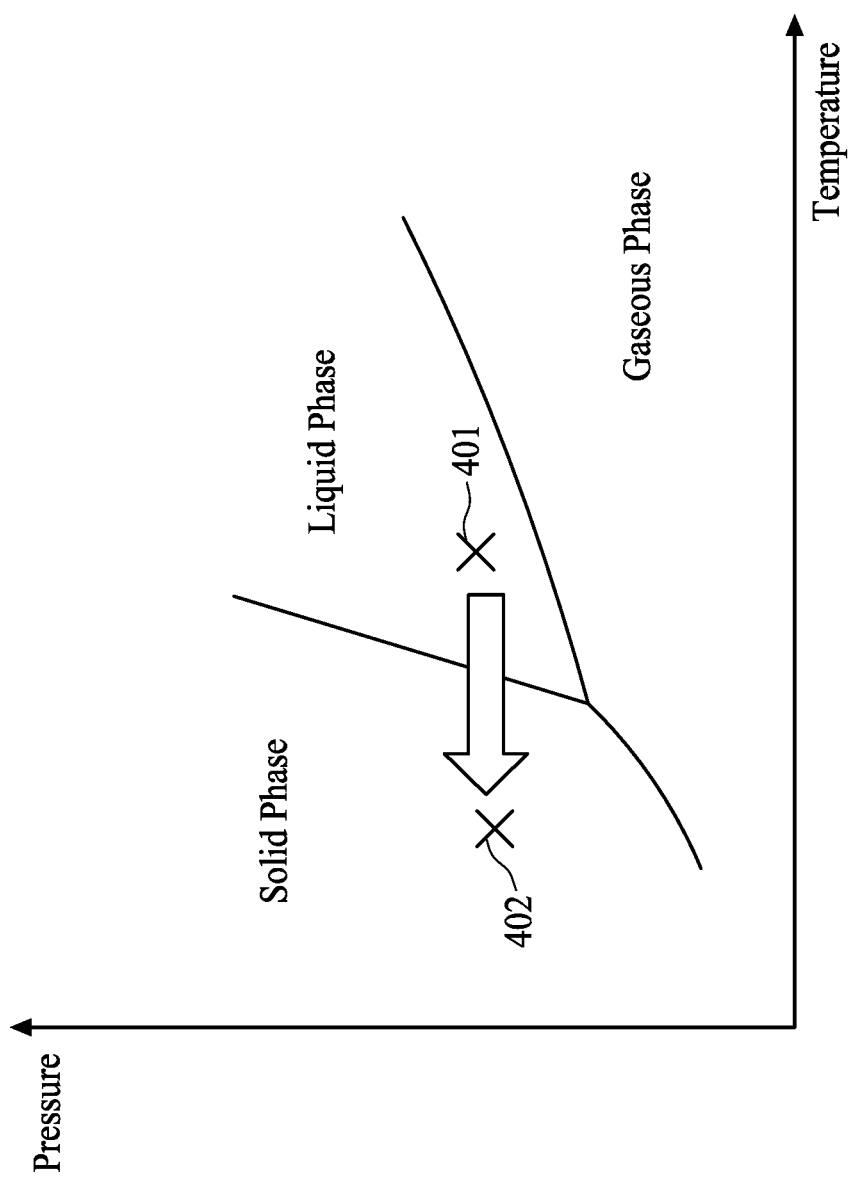
FIG. 8 is a phase diagram illustrating dehydration operation of a semiconductor structure during intermediate stages, in accordance with some embodiments of the present disclosure.

Referring to FIG. 7 and FIG. 8, FIG. 7 is a cross section of a semiconductor structure during intermediate stages of dehydration operations, and FIG. 8 is a phase diagram illustrating dehydration operation of a semiconductor structure during intermediate stages, in accordance with some embodiments of the present disclosure. A temperature of the dehydrating chemical 4 can be lowered to at least $\Delta T_1$ degrees less than the ambient temperature $T_9$ inside the chamber 9, wherein $\Delta T_1$ is greater than $\Delta T_0$. Alternatively stated, the dehydrating chemical 4 is cooled down to a temperature below the melting point of the dehydrating chemical 4, thus the dehydrating chemical 4 is solidified. A phase diagram in FIG. 8 illustrates the process of the dehydrating chemical 4 in liquid form being cooled down and transformed into a dehydrating chemical in solid form 4'. When the dehydrating chemical 4 is in liquid form, it is represented as a dot 401 within the liquid phase in the phase diagram. In some embodiments, the temperature of the dehydrating chemical 4 is lowered, thereby the state of the dehydrating chemical 4 changes from liquid form to solid form. As shown in the phase diagram, the state of the dehydrating chemical 4 moves from the dot 401 to a dot 402 within the solid phase area, wherein the dot 401 and the dot 402 are separated by the liquid-solid phase boundary.

In some embodiments, the process of cooling down the dehydrating chemical 4 includes purging a coolant 8 toward the second side 1B of the substrate 1. In some embodiments, the coolant 8 may include deionized water (DI), isopropyl alcohol (IPA), mixtures of isopropyl alcohol (IPA) and deionized water (DI), perfluoropolyether (PFPE), heavy water, refrigerant, cooling air, inert gases, ethylene glycol ($C_2H_6O_2$), liquid metals, fluorocarbons, propylene glycol ($C_3H_8O_2$), methanol solution, ethanol solution, aliphatics, calcium chloride solution, potassium formate, acetate solution, carbon dioxide, liquid nitrogen, liquid oxygen, liquid hydrogen, nanofluid, freon, silicones, silicate-ester, aromatic hydrocarbon, liquidus polymer, or the like. In some other embodiments, the coolant 8 is purged toward the first side 1T of the substrate 1. In some other embodiments, the process of cooling down may include indirect contact between the substrate 1 and a plurality of cooling pipes or solid coolers. The form of the coolant 8 is not limited herein; any liquid, gas, or compounds that can sustain at a predetermined temperature stably are under consideration.

It should be noted that in some embodiments, the melting point of the dehydrating chemical 4 is tuned to be above a predetermined temperature, so the cost of the coolant 8 can be lowered since the requirement with regard to temperature of the coolant 8 for lowering the temperature of the dehydrating chemical 4 to at least $\Delta T_1$ degrees less than the ambient temperature $T_9$ is lowered. For example, the melting point of the dehydrating chemical 4 having a mixture of IPA and TBA may be in a range from about 0° C. to about 20° C., but the present disclosure is not limited thereto. In some embodiments, in order to obtain a more stable solidified dehydrating chemical 4', the temperature of the solidified dehydrating chemical 4' to at least 5 degrees less than the ambient temperature $T_9$ inside the chamber 9 is lowered. Alternatively stated, $\Delta T_1$ can be set as 5 degrees, but the present disclosure is not limited thereto. In some other embodiments, the coolant 8 may be optionally purged before dehydrating chemical 4 in liquid form is dispensed over the substrate 1, that is, in order to shorten the duration of the cooling process, the coolant 8 can preliminarily applied on the substrate 1 to cool down thereof.

Figure 9:
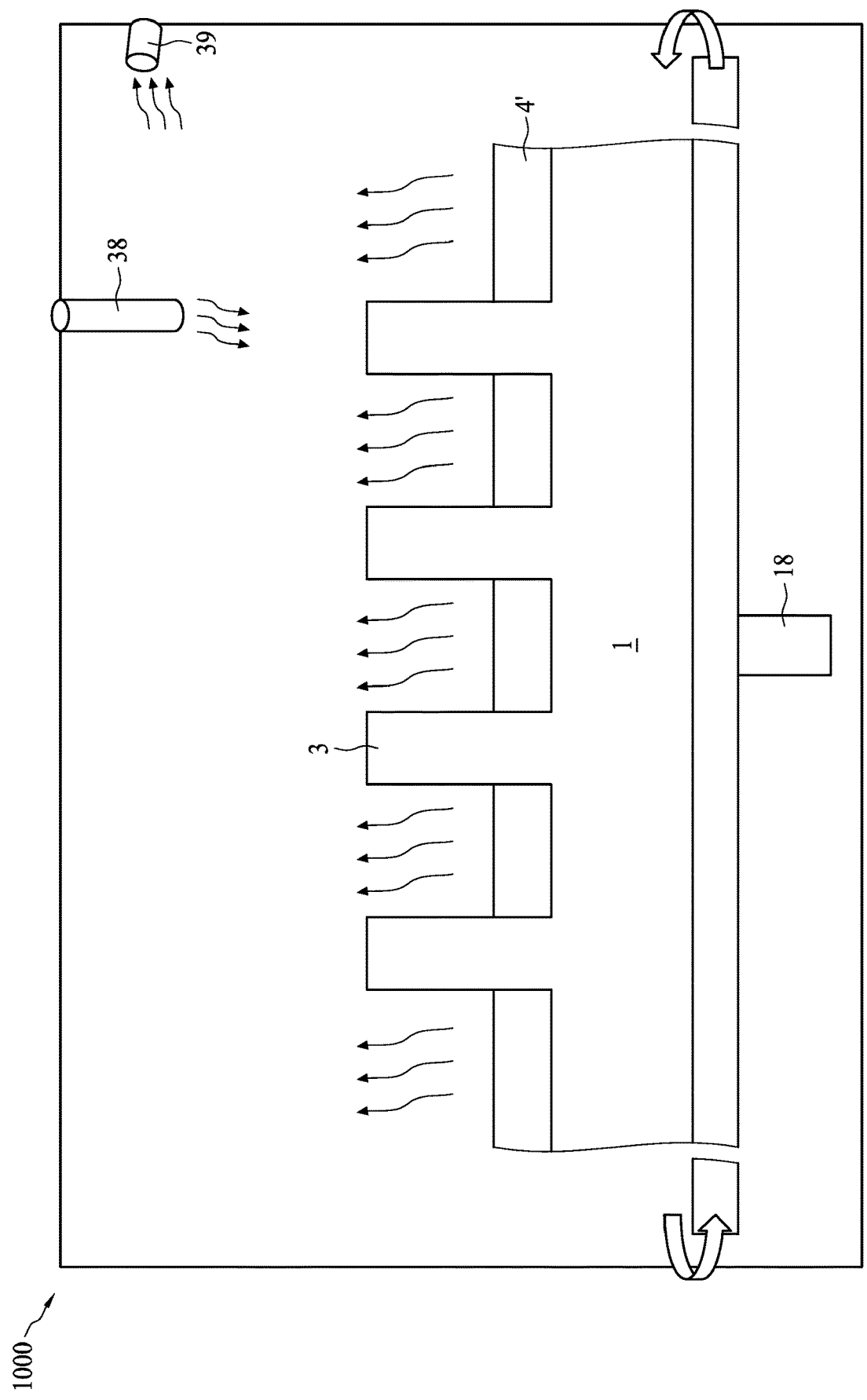
FIG. 9 is a cross section of a semiconductor structure during intermediate stages of dehydration operations, in accordance with some embodiments of the present disclosure.
Figure 10:
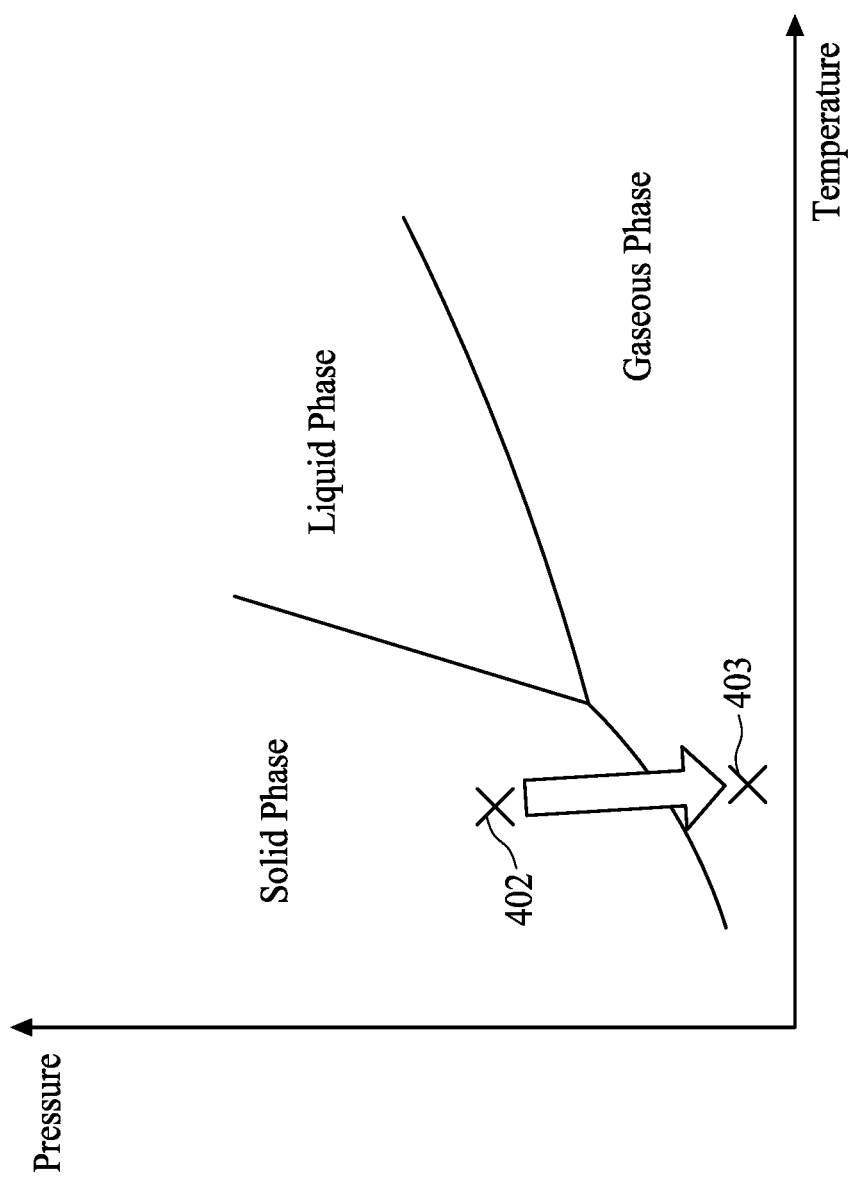
FIG. 10 is a phase diagram illustrating dehydration operation of a semiconductor structure during intermediate stages, in accordance with some embodiments of the present disclosure.

Referring to FIG. 2, FIG. 9 and FIG. 10, FIG. 9 is a cross section of a semiconductor structure during intermediate stages of dehydration operations, and FIG. 10 is a phase diagram illustrating dehydration operation of a semiconductor structure during intermediate stages, in accordance with some embodiments of the present disclosure. The surfaces of the plurality of trenches 2 and the plurality of fins 3 may be dehydrated by vaporizing the solidified dehydrating chemical 4'. The solidified dehydrating chemical 4' transforming from solid form directly to vapor form, and the residual moisture on the surfaces of the plurality of trenches 2 and the fins 3 may be removed concurrently. In order to shorten the duration of dehydration, the solidified dehydrating chemical 4' may have a saturated vapor pressure greater than a predetermined pressure under standard pressure (1 atm). The vapor pressure is an indication of the vaporization rate of a given substance. Specifically, the vapor pressure relates to the tendency of particles to escape from the solid phase, that is, a substance with a high vapor pressure at given temperatures is often referred to be rather volatile.

Each of the first chemical and the second chemical may have a saturated vapor pressure greater than a predetermined pressure $P_{SV}$ under standard pressure (1 atm). For example, the predetermined pressure $P_{SV}$ can be set as 1 kPa. Under this circumstances, IPA can be selected as the first chemical, wherein IPA has a melting point about −89° C. (which may be below the ambient temperature $T_9$ inside the chamber 9) and a saturated vapor pressure about 5.3 kPa (which may be greater than the predetermined pressure $P_{SV}$, e.g. 1 kPa) under the ambient temperature $T_9$ and standard pressure. TBA can be selected as the second chemical, wherein TBA has a melting point about 25° C. (which may be greater than the ambient temperature $T_9$ inside the chamber 9) and a saturated vapor pressure about 4.1 kPa (which may be greater than the predetermined pressure $P_{SV}$, e.g. 1 kPa) under the ambient temperature $T_9$ and standard pressure (1 atm). Other suitable chemicals with similar properties may also be selected as the first chemical or the second chemical.

During the phase transition from solidified dehydrating chemical 4' to vapor form, the process does not pass through the intermediate liquid phase, as shown in the phase diagram in FIG. 10. The state of the solidified dehydrating chemical 4' moves from dot 402 to a dot 403 within the gaseous phase, wherein the dot 402 and dot 403 are separated by the solid-gaseous phase boundary. In order to realize a solid-to-vapor transformation without inducing substantially higher cost, the melting point of the dehydrating chemical 4 is greater than a predetermined temperature, such as 0° C., −5° C., or the like.

It should be noted that the pressure in phase diagram (y-axis in FIG. 8 and FIG. 10) refers to the partial pressure of the dehydrating chemical 4 in vapor form instead of the total (e.g. atmospheric) pressure of the entire system. In other words, the partial pressure of the dehydrating chemical 4 in vapor form is lowered during the process of vaporizing the solidified dehydrating chemical 4'. Also as Le Chatelier's principle stated, if a dynamic equilibrium is disturbed by changing the conditions, the position of equilibrium shifts to counteract the change to reestablish equilibrium. If a given vapor experiences a change in partial pressure or concentration, the tendency shifts in the opposite direction to offset the change. Alternatively stated, lowering the partial vapor pressure of dehydrating chemical 4 in vapor form may stimulate the vaporization operation of the solidified dehydrating chemical 4'.

In order to increase the vaporization rate of the solidified dehydrating chemical 4', at least one of the partial pressure of the first chemical in vapor form and the partial pressure of the second chemical vapor form inside the chamber 9 is lowered. In some embodiments, a partial vapor pressure of the dehydrating chemical 4 in vapor form inside the chamber 9 can be lowered. In some embodiments, the apparatus 1000 optionally includes a gas inlet 38, wherein lowering the partial vapor pressure of the dehydrating chemical 4 in vapor form inside the chamber 9 may include purging nitrogen gas ($N_2$) or inert gas through the gas inlet 38 into the chamber 9. As the partial pressure of the nitrogen gas ($N_2$) or inert gas inside the chamber 9 increases, the partial pressure of the dehydrating chemical 4 in vapor form decreases accordingly. Thence the tendency shifts in the opposite direction to offset the decreasing partial pressure of the dehydrating chemical 4 in vapor form, and the vaporization rate of the solidified dehydrating chemical 4' may be stimulated. Alternatively, superheated hydrogen oxide steam ($H_2O$) can also be purged into the chamber 9 to lower the partial pressure of the dehydrating chemical 4 in vapor form. Any gas that can be purged inside the chamber without inducing any unintentional chemical reaction with the substrate 1 is within consideration to be applied herein. In some embodiments, the substrate 1 can optionally be spun by the supporter 18 in order to ameliorate the rate and/or the uniformity of vaporization operation. Herein since the dehydrating chemical 4 has been solidified prior to this stage, the risk of air-liquid interface tension causing fin collapse may be substantially lowered, thus the substrate 1 can be rotated at a second rotating speed greater than the first rotating speed to further improve the rate and/or the uniformity of vaporization operation.

In some embodiments, the apparatus 1000 optionally includes a gas outlet 39, wherein lowering the partial vapor pressure of the dehydrating chemical 4 in vapor form inside the chamber 9 includes at least partially exhausting the dehydrating chemical 4 in vapor form from the chamber 9 through the gas outlet 39. Since the partial pressure of the dehydrating chemical 4 in vapor form decreases, the tendency shifts in the opposite direction to offset the decreasing partial pressure of the dehydrating chemical 4 in vapor form, thus the vaporization rate of the solidified dehydrating chemical 4' may be stimulated. In some embodiments, the substrate 1 can optionally be spun by the supporter 18 in order to ameliorate the rate and/or the uniformity of vaporization operation. Herein since the dehydrating chemical 4 has been solidified prior to this stage, the risk of air-liquid interface tension causing fin collapse may be substantially lowered, thus the substrate 1 can be rotated at a second rotating speed greater than the first rotating speed to further improve the rate and/or the uniformity of vaporization operation.

Figure 11:
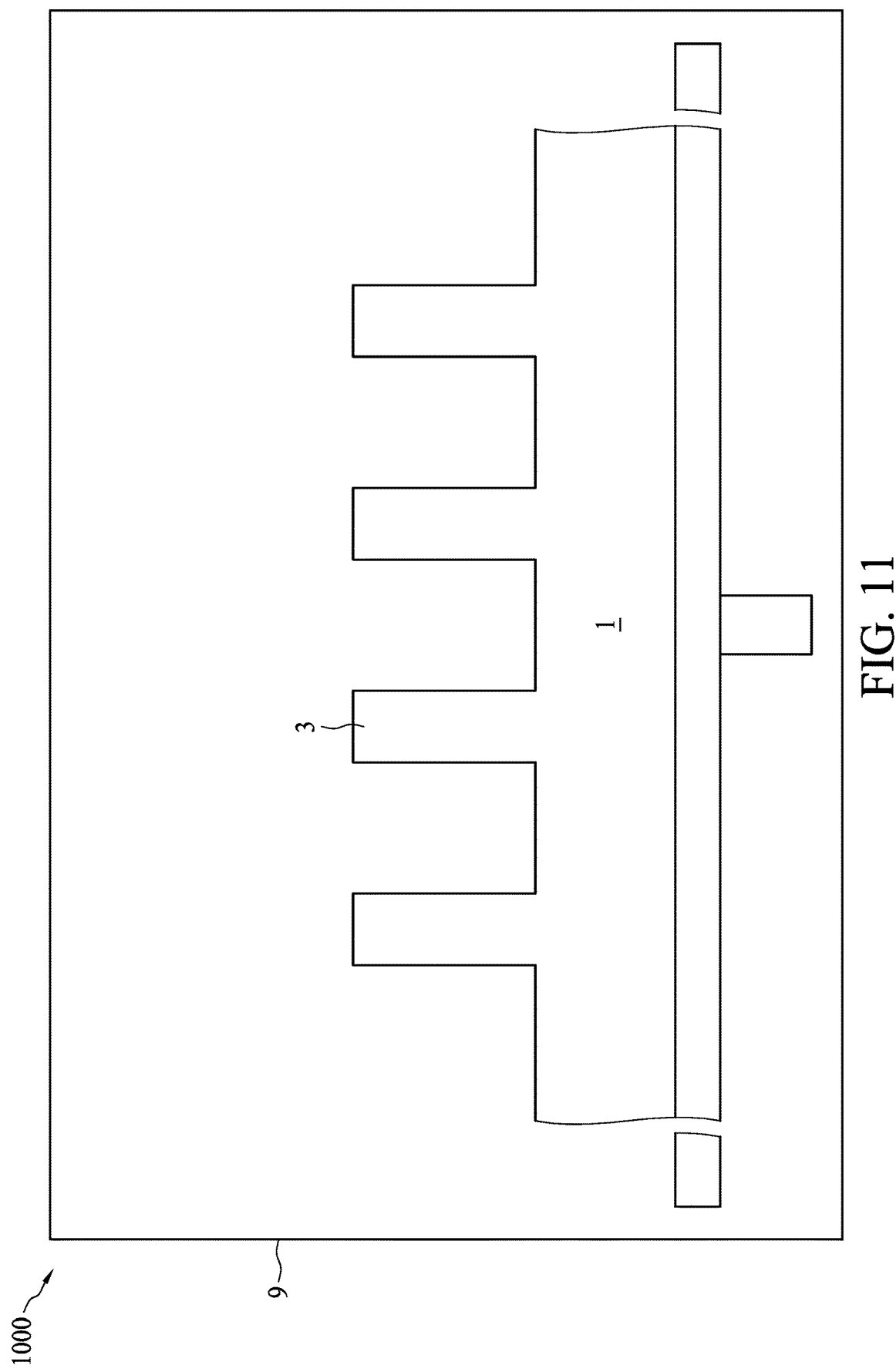
FIG. 11 is a cross section of a semiconductor structure during intermediate stages of dehydration operations, in accordance with some embodiments of the present disclosure.

Referring to FIG. 11, after the solidified dehydrating chemical 4' has been vaporized and removed, the surfaces of the plurality of fins 3 and the plurality of trenches 2 are exposed. After the dehydration operation, the substrate 1 including the fins 3 and/or the trenches 2 can be used in metal gate process, double-gate transistor process, multigate device process, 3D FinFET process, planar FinFET process, gate-all-around process, field-effect transistors process, memory device manufacturing, microprocessor manufacturing, transistor fabrication, display drivers manufacturing, nanowiring, planar transistors manufacturing, processing unit manufacturing, integrated circuit manufacturing, optical device manufacturing, or the like.

Figure 12:
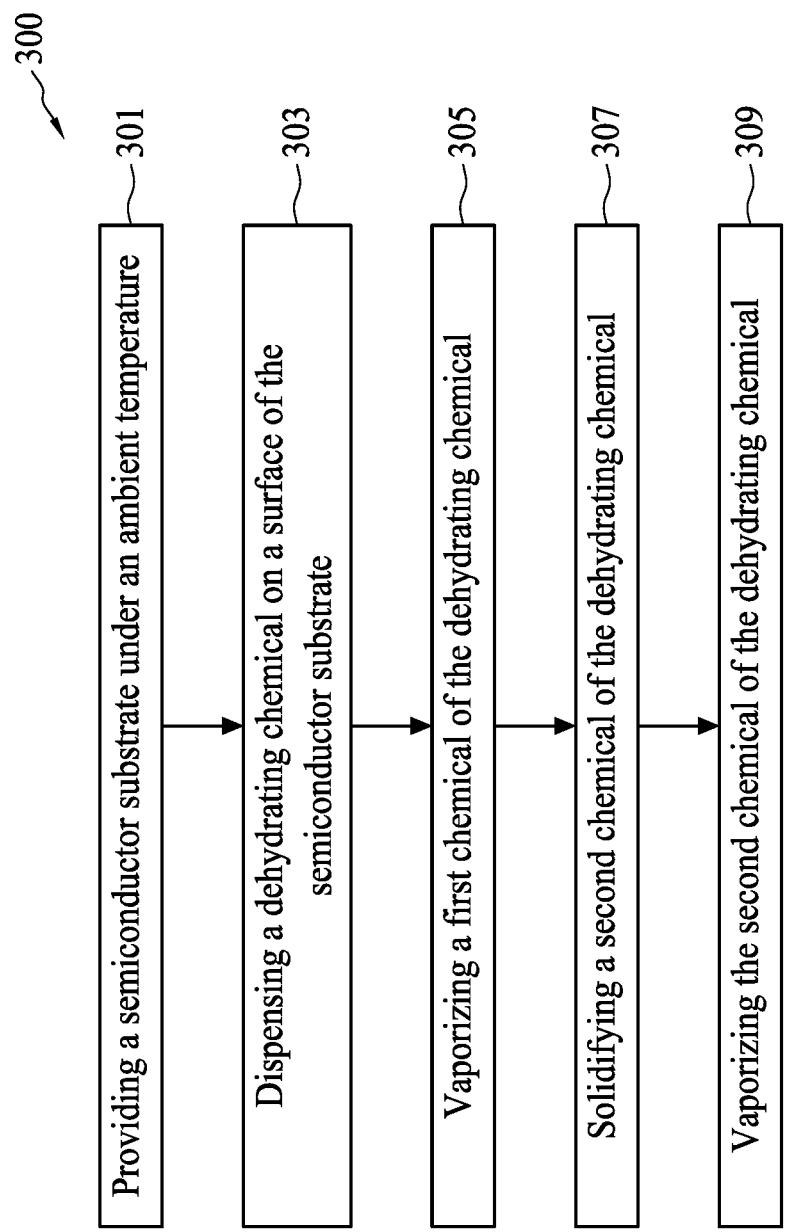
FIG. 12 shows a flow chart representing method for dehydrating a semiconductor structure, in accordance with some embodiments of the present disclosure.

FIG. 12 to FIG. 16 illustrates another method for dehydrating a semiconductor structure. Referring to FIG. 12, FIG. 12 shows a flow chart representing method for dehydrating a semiconductor structure, in accordance with some embodiments of the present disclosure. The method 300 for dehydrating a semiconductor structure may include providing a semiconductor substrate under an ambient temperature (operation 301), dispensing a dehydrating chemical on a surface of the semiconductor substrate (operation 303), vaporizing a first chemical of the dehydrating chemical (operation 305), solidifying a second chemical of the dehydrating chemical (operation 307), and vaporizing the second chemical of the dehydrating chemical (operation 309).

Figure 13:
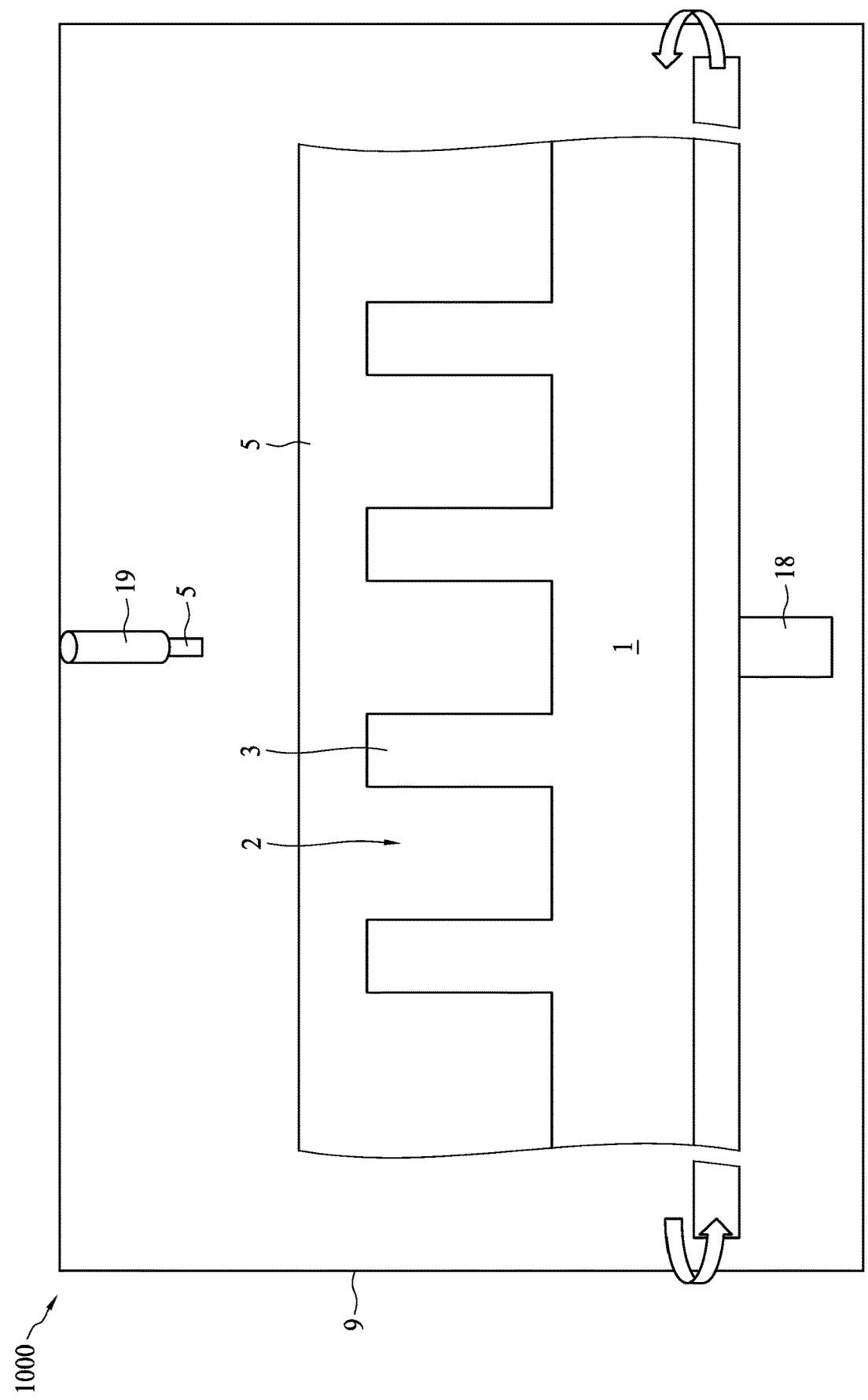
FIG. 13 is a cross section of a semiconductor structure during intermediate stages of dehydration operations, in accordance with some embodiments of the present disclosure.

Subsequent to the operations previously discussed in FIG. 3 and FIG. 4, a substrate 1 to be dehydrated is provided above the supporter 18 in the apparatus 1000. Referring to FIG. 2 and FIG. 13, FIG. 13 is a cross section of a semiconductor structure during intermediate stages of dehydration operations, in accordance with some embodiments of the present disclosure. A dehydrating chemical 5 is applied on the first side 1T of the substrate 1 and flowed through the surface of the plurality of trenches 2 and the surface of the plurality of fins 3. In order to uniformly spread out the dehydrating chemical 5 on the first side 1T of the substrate 1, the dehydrating chemical 5 is in liquid state, instead of in solid state. As previously discussed in FIG. 6, the substrate 1 can optionally be rotated at a first rotating speed by the supporter 18 to prevent the dehydrating chemical 5 from flowing onto the second side 1B (as shown in FIG. 2) of the substrate 1. For example, the first rotating speed is in a range from 0.1 rpm to 50 rpm. The dehydrating chemical 5 can be effectively spun off an edge of the substrate 1 when the first rotating speed is above 0.1 rpm. The first rotating speed is lower than 50 rpm to avoid incurring fin collapse. At least a portion of dispensed dehydrating chemical 5 is spun off the substrate 1 and subsequently drained to the second environment 92 through the second conduit 12.

In some embodiments, the dehydrating chemical 5 at least include a first chemical and a second chemical, wherein the first chemical has a melting point below the ambient temperature $T_9$ inside the chamber 9 and a saturated vapor pressure greater than a predetermined pressure $P_{SV}$ under the ambient temperature $T_9$ and standard pressure (1 atm); while the second chemical has a melting point greater than the ambient temperature $T_9$ inside the chamber 9 and a saturated vapor pressure lower than a predetermined pressure $P_{SV}$ under the ambient temperature $T_9$ and standard pressure (1 atm). Alternatively stated, under ambient temperature $T_9$ and standard pressure, the first chemical is in liquid state and the second chemical is in solid state. In addition, the second chemical may be at least partially dissolved in the first chemical so that the dehydrating chemical 5 can be uniformly applied on the substrate 1. The properties of the first chemical and the second chemical will be subsequently discussed in FIG. 14A and FIG. 14B.

Figure 14A:
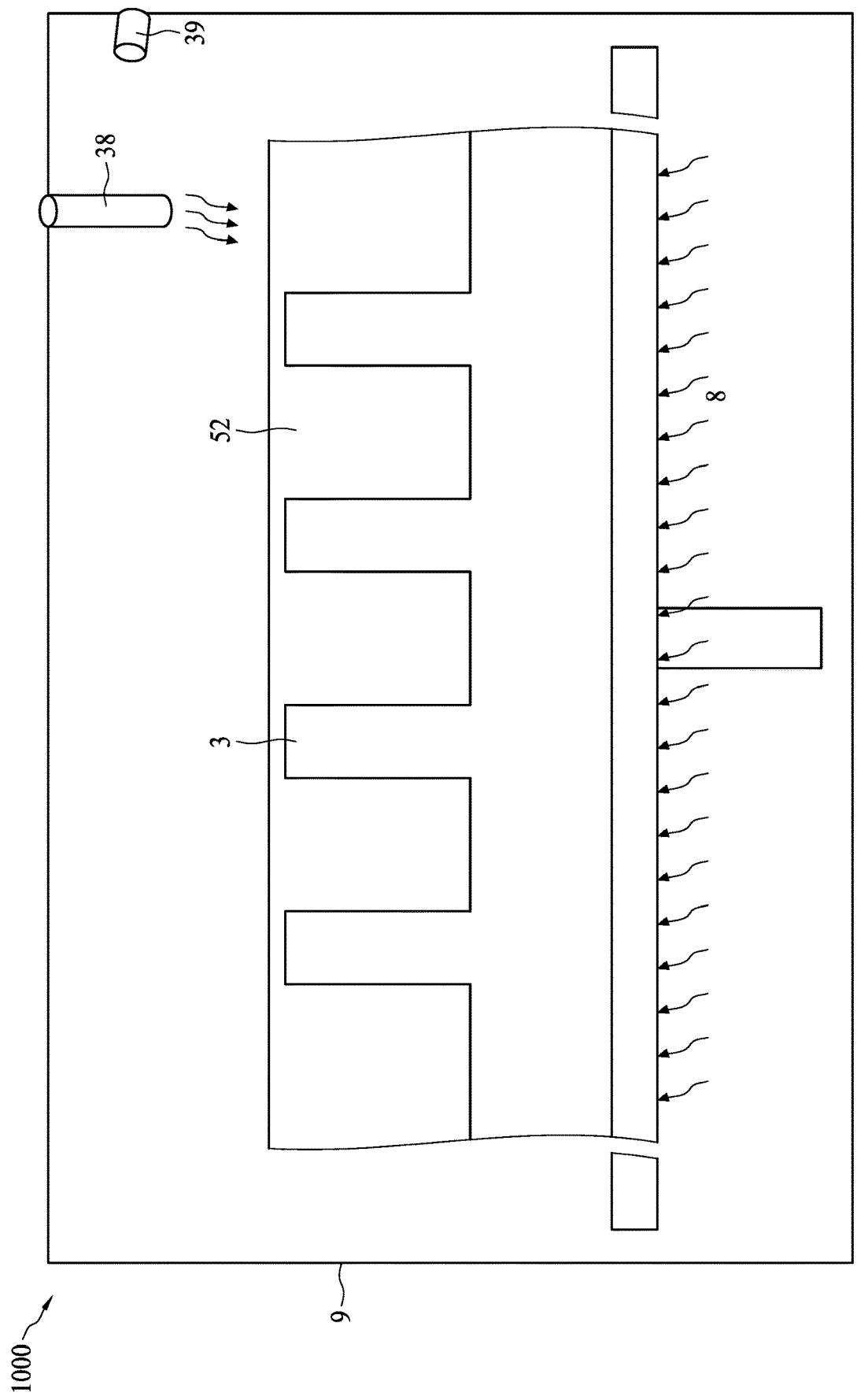
FIG. 14A is a cross section of a semiconductor structure during intermediate stages of dehydration operations, in accordance with some embodiments of the present disclosure.
Figure 14B:
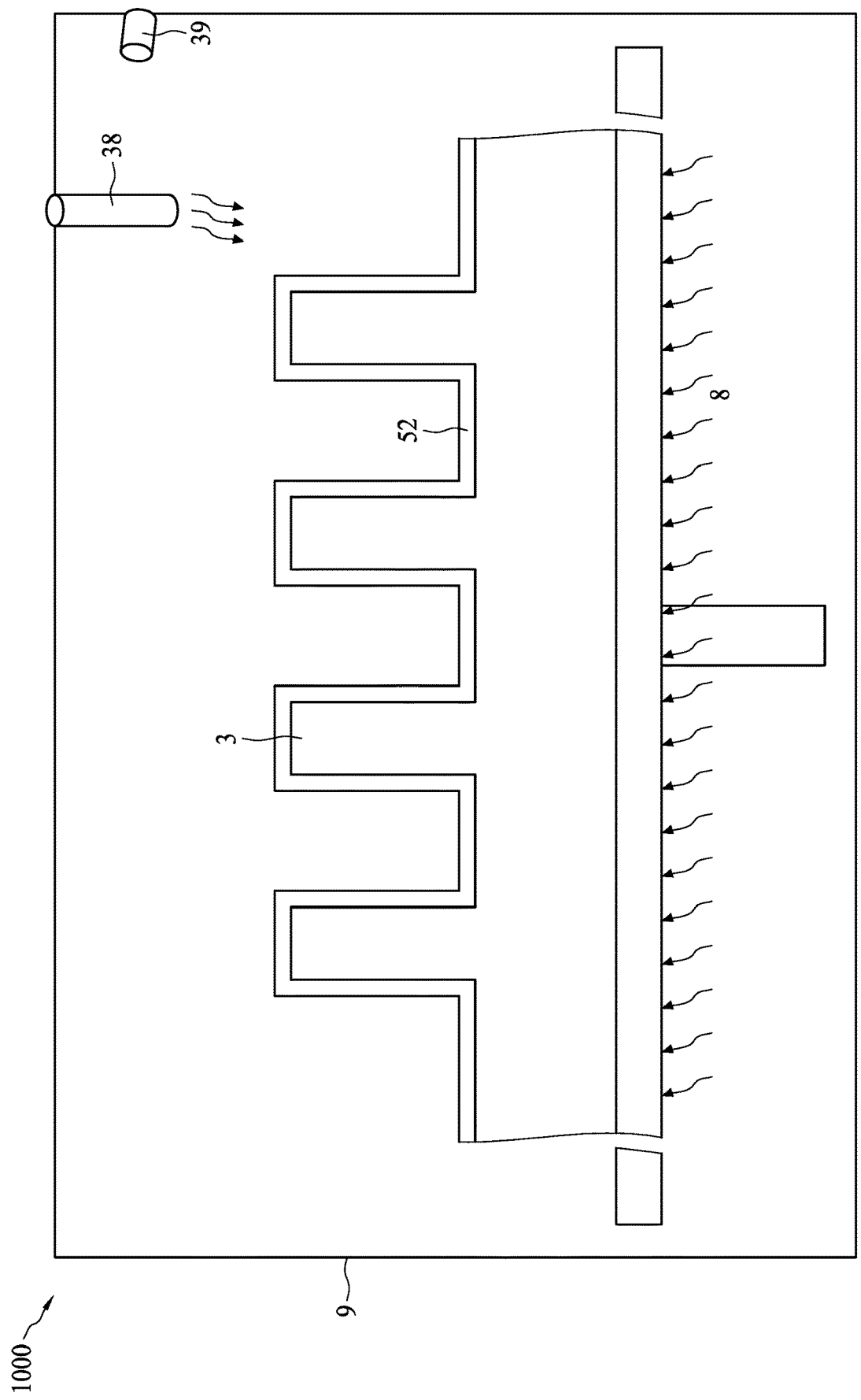
FIG. 14B is a cross section of a semiconductor structure during intermediate stages of dehydration operations, in accordance with some embodiments of the present disclosure.

Referring to FIG. 14A and FIG. 14B, FIG. 14A is a cross section of a semiconductor structure during intermediate stages of dehydration operations, and FIG. 14B is a cross section of a semiconductor structure during intermediate stages of dehydration operations, in accordance with some embodiments of the present disclosure. Subsequently, the first chemical is vaporized from the dehydrating chemical 5, and at least a portion of the second chemical is remained on the substrate 1. In some embodiments, a layer or a film of the solidified second chemical 52 is formed above the substrate 1, as shown in FIG. 14A and FIG. 14B respectively. In order to vaporize the first chemical from the dehydrating chemical 5, a saturated vapor pressure of the first chemical is substantially greater than a saturated vapor pressure of the second chemical under the ambient temperature $T_9$ and standard pressure (1 atm). The saturated vapor pressure of the first chemical is at least greater than a predetermined pressure $P_{SV}$, and the saturated vapor pressure of the second chemical is at least less than a predetermined pressure $P_{SV}$. Alternatively stated, a vaporizing rate of the first chemical is greater than a vaporizing rate of the second chemical under the ambient temperature $T_9$ and standard pressure (1 atm).

For example, the pressure $P_{SV}$ can be set as 1 kPa, thus IPA can be selected as the first chemical, wherein IPA has a melting point about −89° C. (which may be less than the ambient temperature $T_9$ inside the chamber 9) and a saturated vapor pressure about 5.3 kPa (which may be greater than the predetermined pressure $P_{SV}$, e.g. 1 kPa) under standard pressure (1 atm). Hexachloroethane can be selected as the second chemical, wherein hexachloroethane has a melting point about 183° C. (which may be greater than the ambient temperature $T_9$ inside the chamber 9) and a saturated vapor pressure about 0.027 kPa (which may be less than the predetermined pressure $P_{SV}$, e.g. 1 kPa) under standard pressure (1 atm). In some other embodiments, the saturated vapor pressure of the first chemical and the saturated vapor pressure of the second chemical can be subjected to different standards, for example, the saturated vapor pressure of the first chemical is set to be greater than 1 kPa and the saturated vapor pressure of the second chemical is set to be under 0.1 kPa, but the present disclosure is not limited thereto.

Other suitable materials having similar properties can be used as the first chemical or the second chemical. For example, the first chemical may include at least one of the isopropyl alcohol (IPA), $CH_3COCH_3$ (acetone), propylene glycol monomethyl ether acetate (PGMEA), propylene glycol monomethyl ether (PGMEA), a mixture consist of at least two of the aforementioned chemicals, or the like. In some embodiments, the second chemical may include at least one of the tert-butanol (TBA), hexachloroethane, pentaerythritol, camphor, tropinone, norcamphor, naphthalene, cyclohexanol, camphene, borneol, and isoborneol. For exemplary demonstration, the dehydrating chemical 5 may be composed of 97% (weight percentage) of IPA and 3% (weight percentage) of hexachloroethane.

The difference between the saturated vapor pressure of the first chemical and the second chemical can generate a difference between the vaporizing rate if the first chemical and the second chemical, thus the first chemical can be vaporized in a relatively short duration and at least a portion of the second chemical can be remained on the substrate 1 and thereby solidified by cooling. Solidified second chemical may form a solidified layer or a film. It should be noted that the vaporization process of the first chemical can the second chemical may include direct transformation for solid state to vapor state in order to avoid liquid-gas surface tension induced fin collapse issues.

Similar to the previous discussion in FIG. 9 and FIG. 10, in order to increase the vaporization rate of the first chemical, the partial pressure of the first chemical in vapor form inside the chamber 9 is lowered. In some embodiments, the apparatus 1000 optionally includes a gas inlet 38, wherein lowering the partial vapor pressure of the first chemical in vapor form inside the chamber 9 may include purging nitrogen gas ($N_2$), superheated hydrogen oxide steam ($H_2O$), inert gas, or other suitable gas through the gas inlet 38 into the chamber 9, thus a vaporization rate of the first chemical may be stimulated. In some embodiments, the substrate 1 can optionally be spun by the supporter 18 in order to ameliorate the rate and/or the uniformity of vaporization operation. Herein during the vaporization of the first chemical, the substrate 1 can be rotated at a second rotating speed greater than the first rotating speed to further improve the rate and/or the uniformity of vaporization operation.

In some embodiments, the apparatus 1000 optionally includes a gas outlet 39, wherein lowering the partial vapor pressure of the first chemical in vapor form inside the chamber 9 includes at least partially exhausting the first chemical in vapor form from the chamber 9 through the gas outlet 39. Since the partial pressure of the first chemical in vapor form decreases, the tendency shifts in the opposite direction to offset the decreasing partial pressure of the first chemical in vapor form, as the vaporization process of the solidified first chemical may be stimulated. In some embodiments, the substrate 1 can optionally be spun by the supporter 18 in order to ameliorate the rate and/or the uniformity of vaporization operation. Herein during the vaporization of the first chemical, the substrate 1 can be rotated at a second rotating speed greater than the first rotating speed to further improve the rate and/or the uniformity of vaporization operation.

In some embodiments, the solidification of the second chemical on the substrate 1 may optionally include cooling down the substrate 1 and the second chemical to expedite the operation of solidifying the second chemical. In some embodiments, the cool-down operation may include purging a coolant 8, similar to the operations as previously discussed in FIG. 7. In some other embodiments, if the melting point of the second chemical is substantially greater than the ambient temperature $T_9$ inside the chamber 9, the operation of cooling down the substrate 1 may be skipped. For example, in the case of hexachloroethane being selected as the second chemical, since hexachloroethane has a melting point about 183° C. (which is substantially greater than the ambient temperature $T_9$), the cool-down operation may, or may not be performed since the hexachloroethane can be solidified under the ambient temperature $T_9$. In the case of a second chemical having a melting point above but proximal to the ambient temperature $T_9$, the cool-down operation may be performed to ensure the solidification of the second chemical may not be deteriorated by fluctuation of the ambient temperature $T_9$.

Figure 15:
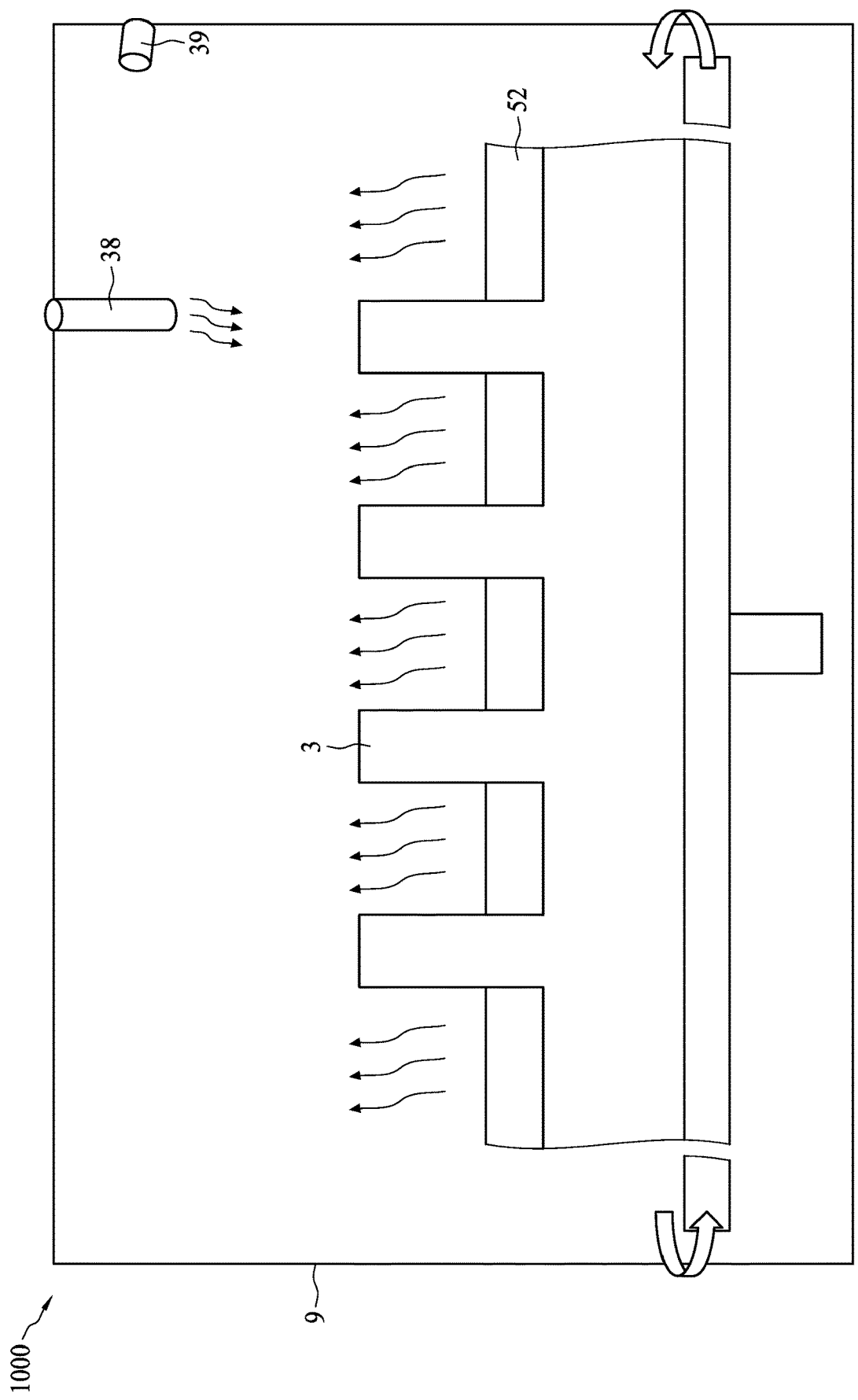
FIG. 15 is a cross section of a semiconductor structure during intermediate stages of dehydration operations, in accordance with some embodiments of the present disclosure.

Referring to FIG. 15, FIG. 15 is a cross section of a semiconductor structure during intermediate stages of dehydration operations, in accordance with some embodiments of the present disclosure. Subsequent to the operation of solidifying the second chemical, the solidified second chemical 52 (the solidified layer as shown in FIG. 14A or the film as shown in FIG. 14B) transforms directly from solid form to vapor form, and the residual moisture on the surfaces of the plurality of trenches 2 and the fins 3 may be removed concurrently. It is noteworthy that a saturated vapor pressure of the second chemical is within a predetermined range, wherein the saturated vapor pressure of the second chemical less than the predetermined pressure $P_{SV}$ (as previously discussed in FIG. 13), so that at least a portion of the second chemical is remained on the substrate 1 after the first chemical is vaporized. On the other hand, the saturated vapor pressure of the second chemical is greater than a predetermined value $P_{lower}$ so that the duration of dehydration operation can be performed within a reasonable period of time.

Similar to the vaporization operation of the first chemical as previously discussed in FIG. 14A and FIG. 14B, in order to shorten the a partial pressure of the second chemical can be lowered by purging nitrogen gas ($N_2$), superheated hydrogen oxide steam ($H_2O$), inert gas, or other suitable gas through the gas inlet 38 into the chamber 9 or exhausting the second chemical in vapor form from the chamber 9 through the gas outlet 39. Optionally, the substrate 1 can be rotated at a third rotating speed greater than the first rotating speed to further improve the rate and/or the uniformity of vaporization operation.

Figure 16:
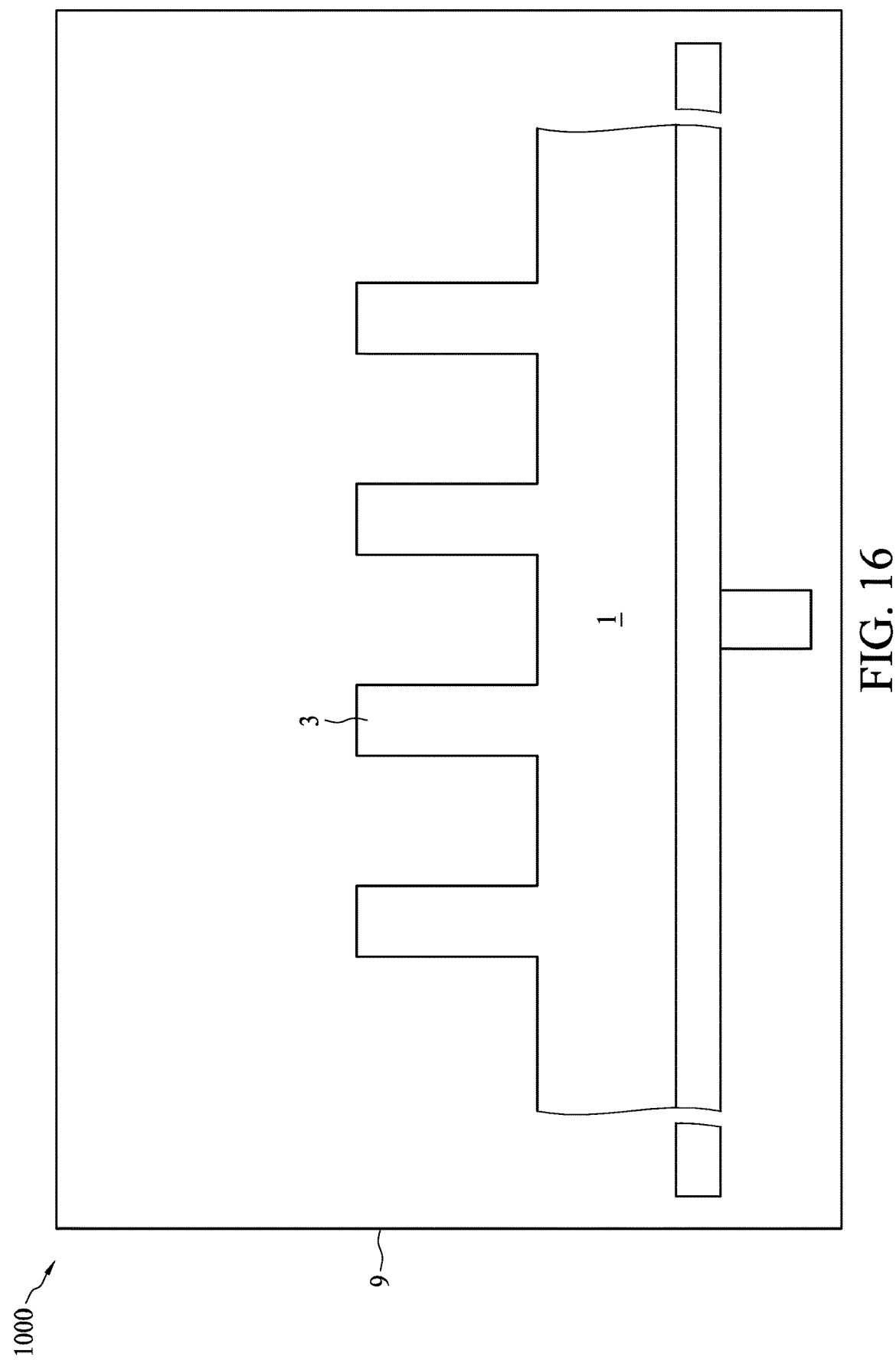
FIG. 16 is a cross section of a semiconductor structure during intermediate stages of dehydration operations, in accordance with some embodiments of the present disclosure.

Referring to FIG. 16, FIG. 16 is a cross section of a semiconductor structure during intermediate stages of dehydration operations, in accordance with some embodiments of the present disclosure. Subsequent to the solidified second chemical being vaporized and removed, the surfaces of the plurality of fins 3 and the plurality of trenches 2 are dehydrated and exposed. After the dehydration operation, the substrate 1 including the fins 3 and/or the trenches 2 can be used in metal gate process, double-gate transistor process, multigate device process, 3D FinFET process, planar FinFET process, gate-all-around process, field-effect transistors process, memory device manufacturing, microprocessor manufacturing, transistor fabrication, display drivers manufacturing, nanowiring, planar transistors manufacturing, processing unit manufacturing, integrated circuit manufacturing, optical device manufacturing, or the like.

Figure 17:
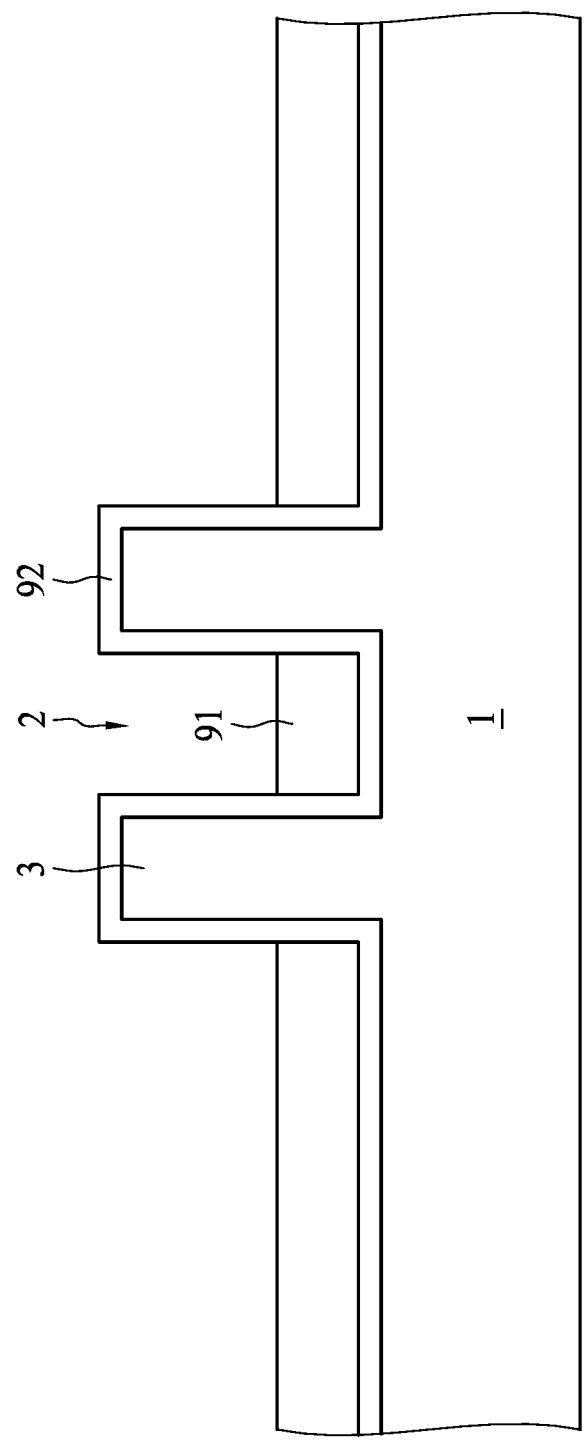
FIG. 17 is a cross sectional view showing a semiconductor structure during an intermediate stage of manufacturing operations, in accordance with some embodiments of the present disclosure.

Referring to FIG. 17, FIG. 17 is a cross sectional view showing a semiconductor structure during an intermediate stage of manufacturing operations, in accordance with some embodiments of the present disclosure. In some embodiments, subsequent to the dehydration operations as discussed in FIG. 5 to FIG. 11 or dehydration operations as discussed in FIG. 12 to FIG. 16, a liner layer 92 is formed on surfaces of trenches 2 and fins 3, and a shallow trench isolation (STI) 91 is formed around a bottom portion of the fins 3. In some other embodiments, the liner 92 and the STI may also be formed prior to aforementioned dehydration operation.

Figure 18:
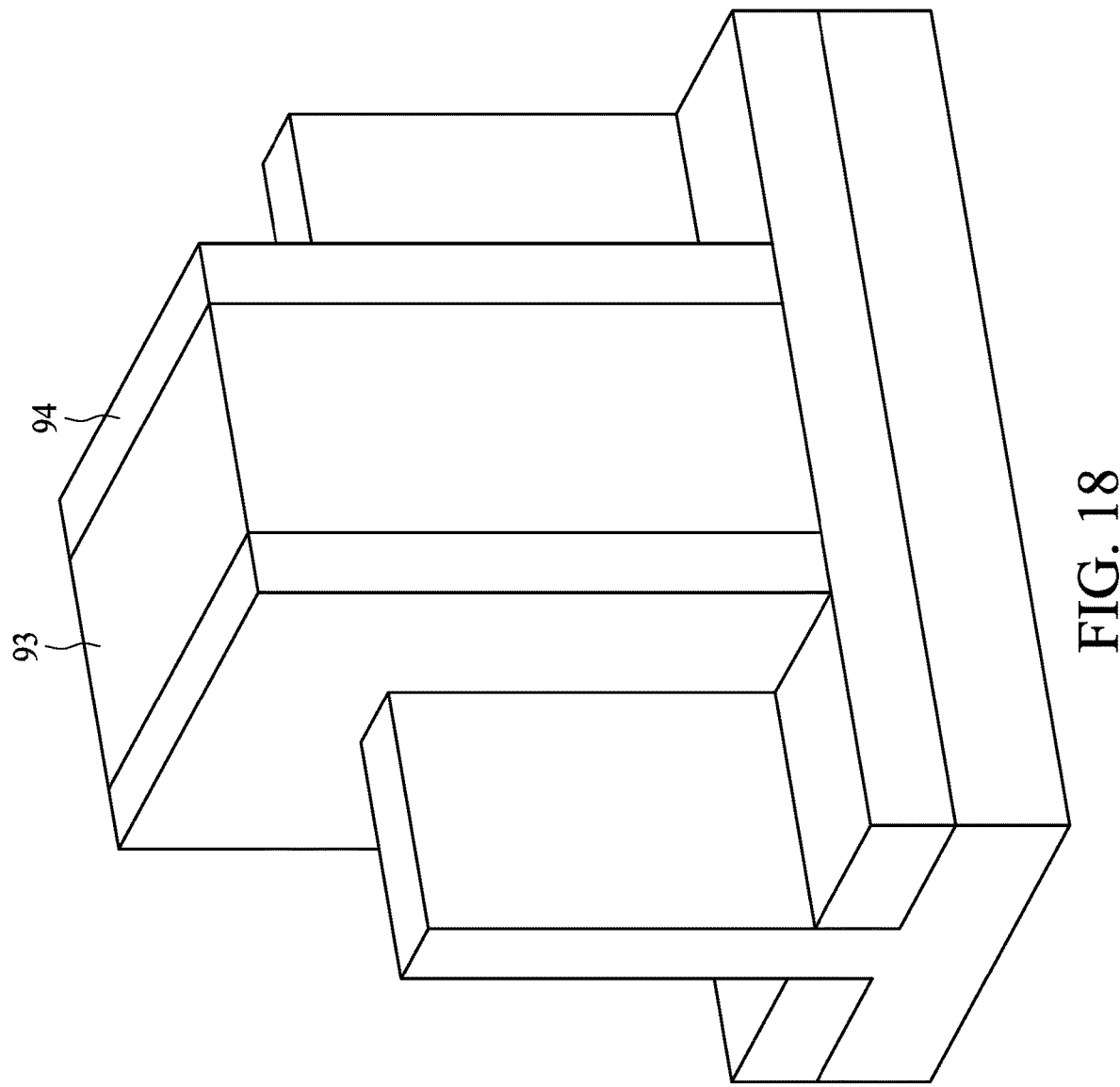
FIG. 18 is a 3D perspective view showing a semiconductor structure during an intermediate stage of manufacturing operations, in accordance with some embodiments of the present disclosure.

Referring to FIG. 18, FIG. 18 is a 3D perspective view showing a semiconductor structure during an intermediate stage of manufacturing operations, in accordance with some embodiments of the present disclosure. Subsequently, a sacrificial gate 93 and a spacer 94 are orthogonally formed across a fin 3.

Figure 19:
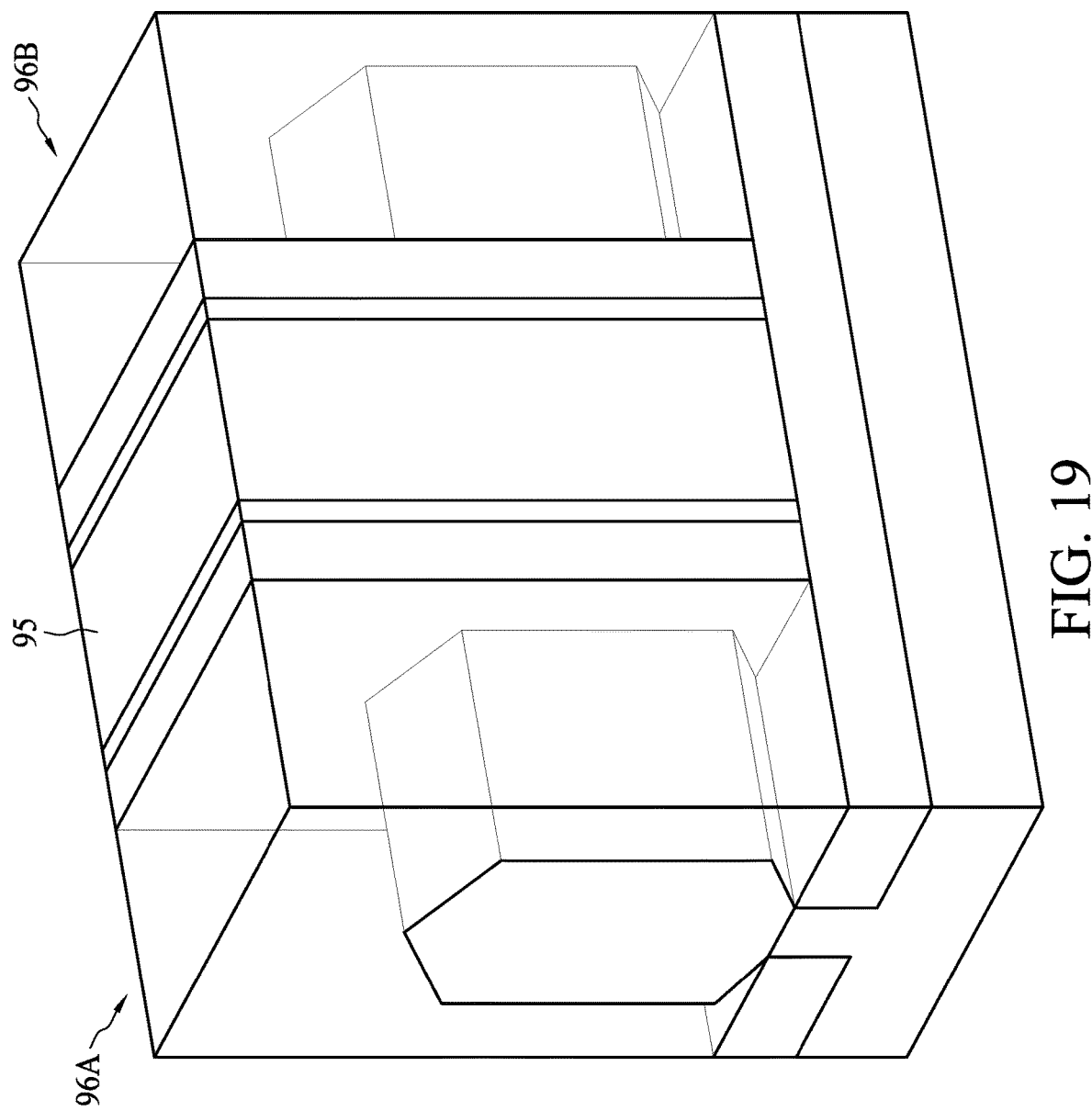
FIG. 19 is a 3D perspective view showing a semiconductor structure during an intermediate stage of manufacturing operations, in accordance with some embodiments of the present disclosure.

Referring to FIG. 19, FIG. 19 is a 3D perspective view showing a semiconductor structure during an intermediate stage of manufacturing operations, in accordance with some embodiments of the present disclosure. Subsequently the sacrificial gate 93 is replaced by a high-k gate stack 95, and source/drain features are formed on exposed areas of fins 3 to form source/drain regions 96A, 96B. It should be noted that the present disclosure is not limited to operations as discussed in FIG. 17 to FIG. 19, the dehydration methods disclosed in the present disclosure can also be utilized in any suitable fabrication processes such as metal gate process, double-gate transistor process, multigate device process, 3D FinFET process, gate-all-around process, field-effect transistors process, DRAM structure fabrication, memory device manufacturing, microprocessor manufacturing, transistor fabrication, display drivers manufacturing, nanowiring, planar transistors manufacturing, processing unit manufacturing, integrated circuit manufacturing, optical device manufacturing, or the like.

The present disclosure provides a dehydrating chemical 4 for dehydrating a semiconductor substrate under an ambient temperature, an apparatus for dehydrating a semiconductor substrate using the dehydrating chemical 4, and a method for dehydrating a semiconductor substrate by using the dehydrating chemical 4. Herein the dehydrating chemical 4 at least includes a first chemical having a melting point below the ambient temperature and a second chemical having a melting point above the ambient temperature. In order to decrease the risk of clogging up conduits for transporting the dehydrating chemical 4, the melting point of the dehydrating chemical 4 can be tuned by adjusting a ratio of the first chemical and the second chemical in the dehydrating chemical 4, wherein the melting point of the dehydrating chemical 4 is adjusted to be at least $\Delta T_0$ degrees below the ambient temperature. Subsequent to the dehydrating chemical 4 being applied on the substrate, the dehydrating chemical 4 is solidified and then vaporized, and the residue moist can be removed during the operation of vaporizing the solidified dehydrating chemical 4'.

The present disclosure provides a dehydrating chemical 5 for dehydrating a semiconductor substrate under an ambient temperature, an apparatus for dehydrating a semiconductor substrate using the dehydrating chemical 5, and a method for dehydrating a semiconductor substrate by using the dehydrating chemical 5. Herein the dehydrating chemical 5 at least includes a first chemical having a melting point below the ambient temperature and a second chemical having a melting point above the ambient temperature. The second chemical may be dissolved in the first chemical, and subsequent to the dehydrating chemical 5 being applied on the substrate, the first chemical is vaporized from the dehydrating chemical 5 and the second chemical is solidified on the substrate. After solidifying the second chemical on the substrate, the second chemical is vaporized and removed from the substrate, thence the residue moist can be removed through the vaporization operation of the second chemical.

The first chemical of the dehydrating chemical 4 or the dehydrating chemical 5 may include, but not limited to, at least one of the isopropyl alcohol (IPA), $CH_3COCH_3$ (acetone), propylene glycol monomethyl ether acetate (PGMEA), propylene glycol monomethyl ether (PGMEA), a mixture consist of at least two of the aforementioned chemicals, or the like. The second chemical of the dehydrating chemical 4 or the dehydrating chemical 5 may include, but not limited to, the second chemical may include at least one of the tert-butanol (TBA), hexachloroethane, pentaerythritol, camphor, tropinone, norcamphor, naphthalene, cyclohexanol, camphene, borneol, and isoborneol.

Some embodiments of the present disclosure provide a dehydrating chemical for dehydrating a semiconductor substrate under an ambient temperature, including a first chemical having a melting point below the ambient temperature, and a second chemical having a melting point greater than the melting point of the first chemical, wherein the dehydrating chemical has a melting point less than the ambient temperature by predetermined $\Delta T_0$ degrees, and at least one of the first chemical and the second chemical has a saturated vapor pressure greater than a predetermined pressure $P_{SV}$ under 1 atm.

Some embodiments of the present disclosure provide a method for dehydrating a semiconductor structure, including providing a semiconductor substrate under an ambient temperature, dispensing a dehydrating chemical on a surface of the semiconductor substrate, wherein the dehydrating chemical includes a first chemical having a melting point below the ambient temperature, and a second chemical having a melting point greater than the melting point of the first chemical, and the dehydrating chemical has a melting point less than the ambient temperature by predetermined $\Delta T_0$ degrees, and solidifying the dehydrating chemical.

Some embodiments of the present disclosure provide a method for forming a semiconductor structure, including forming a fin on a semiconductor substrate, dispensing a dehydrating chemical on a surface of the semiconductor substrate, wherein the dehydrating chemical includes a first chemical having a melting point below an ambient temperature, and a second chemical having a melting point greater than the melting point of the first chemical, and the dehydrating chemical has a melting point less than the ambient temperature, removing the dehydrating chemical from the semiconductor substrate, and forming a gate stack over the fin.

Some embodiments of the present disclosure provide a method for dehydrating a semiconductor structure, including providing a semiconductor substrate under an ambient temperature, dispensing a dehydrating chemical on a surface of the semiconductor substrate, wherein the dehydrating chemical includes a first chemical having a melting point below the ambient temperature and a saturated vapor pressure greater than a predetermined pressure $P_{SV}$ under the ambient temperature and 1 atm, and a second chemical having a melting point greater than the melting point of the first chemical and a saturated vapor pressure below the predetermined pressure $P_{SV}$ under the ambient temperature and 1 atm, and vaporizing the first chemical from the dehydrating chemical.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A dehydrating chemical for dehydrating a semiconductor substrate under an ambient temperature, comprising:
    a first chemical having a melting point below the ambient temperature; and
    a second chemical having a melting point greater than the melting point of the first chemical, wherein the dehydrating chemical has a melting point less than the ambient temperature by predetermined $\Delta T_0$ degrees, and at least one of the first chemical and the second chemical has a saturated vapor pressure greater than a predetermined pressure $P_{SV}$ under 1 atm.

2. The semiconductor structure dehydrating chemical of claim 1, wherein the dehydrating chemical is supplied by a first conduit under a first environment temperature and drained by a second conduit under a second environment temperature, and the melting point of the dehydrating chemical is below the minimum of the first environment temperature and the second environment temperature.

3. The semiconductor structure dehydrating chemical of claim 2, wherein the melting point of the dehydrating chemical is below the first environment temperature and the second environment temperature.

4. The semiconductor structure dehydrating chemical of claim 1, wherein the first chemical comprises at least one of the isopropyl alcohol (IPA), acetone, propylene glycol monomethyl ether acetate (PGMEA), and propylene glycol monomethyl ether (PGME).

5. The semiconductor structure dehydrating chemical of claim 1, wherein the second chemical comprises at least one of the tert-butanol (TBA), hexachloroethane, pentaerythritol, camphor, tropinone, norcamphor, naphthalene, cyclohexanol, camphene, borneol, and isoborneol.

6. The semiconductor structure dehydrating chemical of claim 1, wherein a vaporizing rate of the first chemical is greater than a vaporizing rate of the second chemical.

7. A method for dehydrating a semiconductor structure, comprising:
    providing a semiconductor substrate under an ambient temperature;
    dispensing a dehydrating chemical on a surface of the semiconductor substrate, wherein the dehydrating chemical comprises:
        a first chemical having a melting point below the ambient temperature; and
        a second chemical having a melting point greater than the melting point of the first chemical, and the dehydrating chemical has a melting point less than the ambient temperature by predetermined $\Delta T_0$ degrees; and
    solidifying the dehydrating chemical.

8. The method of claim 7, wherein solidifying the dehydrating chemical comprises cooling the semiconductor substrate.

9. The method of claim 8, wherein solidifying the dehydrating chemical comprises lowering a temperature of the dehydrating chemical to at least $\Delta T_1$ degrees below the ambient temperature, and $\Delta T_1$ is greater than $\Delta T_0$.

10. The method of claim 7, wherein at least one of the first chemical and the second chemical has a saturated vapor pressure greater than a predetermined pressure $P_{SV}$ under the ambient temperature and 1 atm.

11. The method of claim 7, further comprising vaporizing the dehydrating chemical subsequent to solidifying the dehydrating chemical.

12. The method of claim 7, further comprising spinning the substrate subsequent to solidifying the dehydrating chemical.

13. The method of claim 7, further comprising lowering a partial vapor pressure of the dehydrating chemical in vapor form inside a chamber.

14. The method of claim 7, further comprising:
    detecting a first environment temperature of a first environment, wherein the dehydrating chemical is transported in the first environment prior to being dispensed on the semiconductor substrate;

detecting a second environment temperature of a second environment, wherein the dehydrating chemical is transported in the second environment subsequent to being dispensed on the semiconductor substrate; and adjusting a mixing ratio of the first chemical and the second chemical in the dehydrating chemical according to the first environment temperature and the second environment temperature.

15. A method for dehydrating a semiconductor structure, comprising:

providing a semiconductor substrate under an ambient temperature;

dispensing a dehydrating chemical on a surface of the semiconductor substrate, wherein the dehydrating chemical comprises:

a first chemical having a melting point below the ambient temperature and a saturated vapor pressure greater than a predetermined pressure $P_{SV}$ under the ambient temperature and 1 atm; and a second chemical having a melting point greater than the melting point of the first chemical and a saturated vapor pressure below the predetermined pressure $P_{SV}$ under the ambient temperature and 1 atm; and vaporizing the first chemical from the dehydrating chemical.

16. The method of claim 15, further comprising solidifying the second chemical.

17. The method of claim 16, further comprising vaporizing the second chemical subsequent to solidifying the second chemical.

18. The method of claim 17, further comprising lowering a partial vapor pressure of the second chemical in vapor form inside a chamber.

19. The method of claim 15, wherein during the dehydrating chemical is being dispensed on the surface of the semiconductor substrate, the semiconductor substrate is spun at a first rotating speed.

20. The method of claim 19, wherein during the second chemical is being vaporized, the semiconductor substrate is spun at a second rotating speed greater than the first rotating speed.

* * * * *